(12) United States Patent
Pellizzer et al.

(10) Patent No.: US 9,768,378 B2
(45) Date of Patent: Sep. 19, 2017

(54) CROSS-POINT MEMORY AND METHODS FOR FABRICATION OF SAME

(71) Applicant: MICRON TECHNOLOGY, INC., Boise, ID (US)

(72) Inventors: Fabio Pellizzer, Cornate d'Adda (IT); Innocenzo Tortorelli, Cernusco Sul Naviglio (IT); Andrea Ghetti, Concorezzo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/468,036

(22) Filed: Aug. 25, 2014

(65) Prior Publication Data

US 2016/0056208 A1    Feb. 25, 2016

(51) Int. Cl.
*H01L 29/06* (2006.01)
*H01L 45/00* (2006.01)
*H01L 27/24* (2006.01)

(52) U.S. Cl.
CPC ............ *H01L 45/06* (2013.01); *H01L 27/249* (2013.01); *H01L 27/2427* (2013.01); *H01L 45/144* (2013.01); *H01L 45/1675* (2013.01)

(58) Field of Classification Search
USPC .............................................. 257/5; 438/382
See application file for complete search history.

(56) References Cited

U.S. PATENT DOCUMENTS

| 6,404,003 | B1 | 6/2002 | McMillan et al. |
| 8,143,610 | B2 | 3/2012 | Park et al. |
| 8,153,527 | B2 | 4/2012 | Loh et al. |
| 8,535,952 | B2 * | 9/2013 | Ranjan ............. B82Y 10/00 257/295 |
| 9,136,307 | B2 | 9/2015 | Pellizzor |
| 2006/0097240 | A1 | 5/2006 | Lowrey |

(Continued)

FOREIGN PATENT DOCUMENTS

| KR | 10-2004-0068024 | 7/2004 |
| KR | 10-2008-0060321 | 7/2008 |
| KR | 10-2010-0018445 | 2/2010 |

OTHER PUBLICATIONS

Campbell et al., U.S. Appl. No. 14/244,486 entitled, *Semiconductor Structures Including Multi-Portion Liners and Related Methods*, filed Apr. 3, 2014.

(Continued)

*Primary Examiner* — Caleb Henry
(74) *Attorney, Agent, or Firm* — Holland & Hart LLP

(57) ABSTRACT

The disclosed technology generally relates to integrated circuit devices, and in particular to cross-point memory arrays and methods for fabricating the same. Line stacks are formed, including a storage material line disposed over lower a conductive line. Upper conductive lines are formed over and crossing the line stacks, exposing portions of the line stacks between adjacent upper conductive lines. After forming the upper conductive lines, storage elements are formed at intersections between the lower conductive lines and the upper conductive lines by removing storage materials from exposed portions of the line stacks, such that each storage element is laterally surrounded by spaces. A continuous sealing material laterally surrounds each of the storage elements.

12 Claims, 14 Drawing Sheets

(56) References Cited

U.S. PATENT DOCUMENTS

| | | | |
|---|---|---|---|
| 2006/0104110 A1* | 5/2006 | Sun | G11C 11/16 |
| | | | 365/173 |
| 2006/0187703 A1* | 8/2006 | Mizuguchi | B82Y 10/00 |
| | | | 365/158 |
| 2008/0293207 A1 | 11/2008 | Koutny, Jr. | |
| 2009/0231911 A1 | 9/2009 | Liu et al. | |
| 2009/0302362 A1 | 12/2009 | Kikuchi et al. | |
| 2010/0163818 A1 | 7/2010 | Lee | |
| 2010/0237502 A1 | 9/2010 | Yu et al. | |
| 2012/0001145 A1 | 1/2012 | Magistretti et al. | |
| 2012/0080792 A1 | 4/2012 | Zhao | |
| 2012/0220099 A1 | 8/2012 | Dennison | |
| 2012/0224413 A1* | 9/2012 | Zhang | B82Y 10/00 |
| | | | 365/148 |
| 2012/0225534 A1* | 9/2012 | Lee | H01L 45/1675 |
| | | | 438/382 |
| 2012/0235109 A1 | 9/2012 | Nojiri | |
| 2013/0016557 A1 | 1/2013 | Kim | |
| 2013/0043455 A1 | 2/2013 | Bateman | |
| 2013/0056698 A1 | 3/2013 | Satoh | |
| 2013/0137275 A1 | 5/2013 | Tong et al. | |
| 2013/0207068 A1 | 8/2013 | Pellizzer | |
| 2013/0333835 A1 | 12/2013 | Carcia | |
| 2015/0035041 A1* | 2/2015 | Shinohara | H01L 27/1157 |
| | | | 257/324 |
| 2015/0137061 A1 | 5/2015 | Donghi et al. | |
| 2015/0243708 A1 | 8/2015 | Ravasio et al. | |
| 2015/0243885 A1 | 8/2015 | Sciarrillo | |

OTHER PUBLICATIONS

Dameron et al. "Molecular Layer Deposition of Alucone Polymer Films Using Trimethylaluminum and Ethylene Glycol", Chem. Mater. vol. 20:10, 2008, pp. 3315-3326.

International Search Report dated May 7, 2015 for International application No. PCT/US2015/015023.

Jen et al. "Critical tensile strain and water vapor transmission rate for nanolaminate films grown using Al2O3 atomic layer deposition and alucone molecular layer deposition", Applied Physics Letters, vol. 101:234103, 2012, pp. 1-3.

Seghete et al. "Sacrificial layers for air gaps in NEMS using alucone molecular layer deposition", Sensors and Actuators A: Physical, 2009, pp. 1-8.

U.S. Appl. No. 14/535,731, filed Nov. 7, 2014, entitled "Cross-Point Memory and Methods for Fabrication of Same".

* cited by examiner

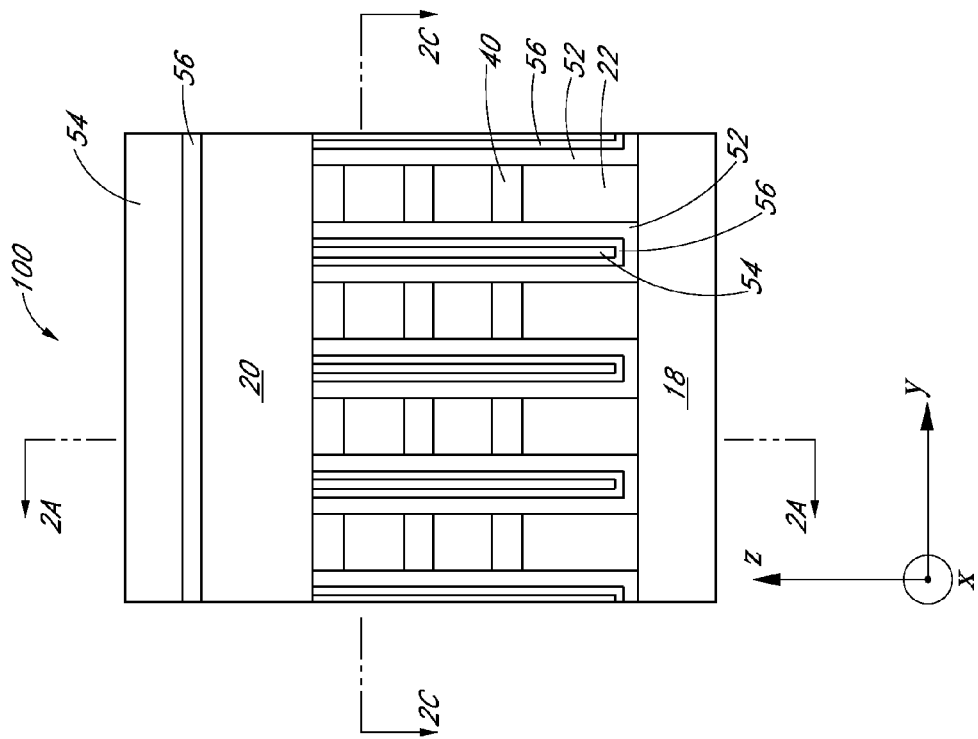
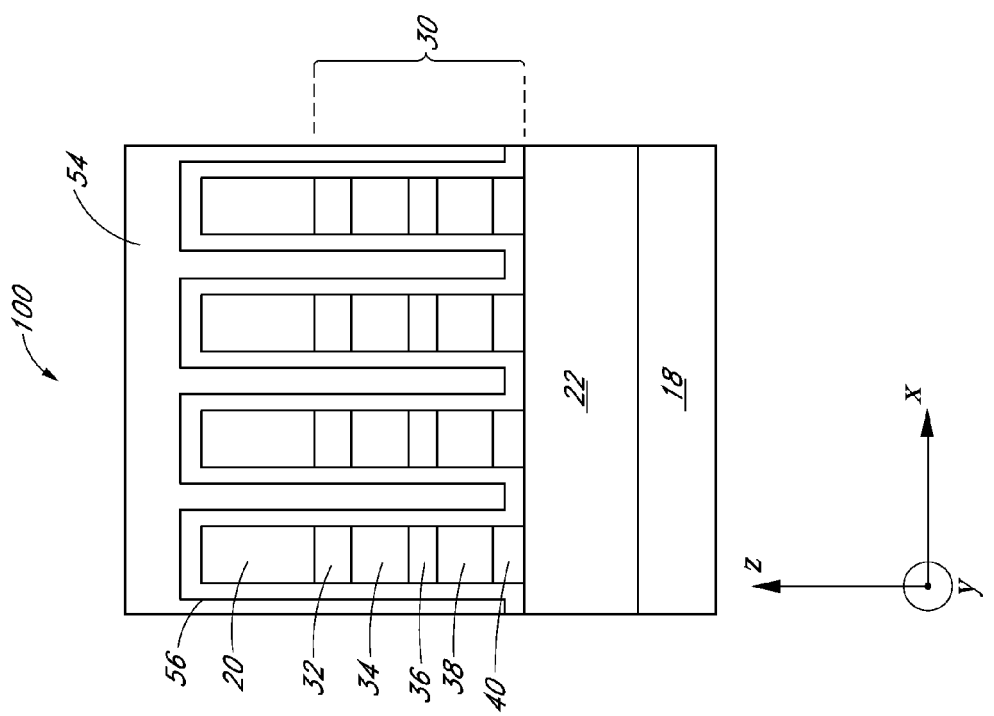
FIG. 2B
FIG. 2A

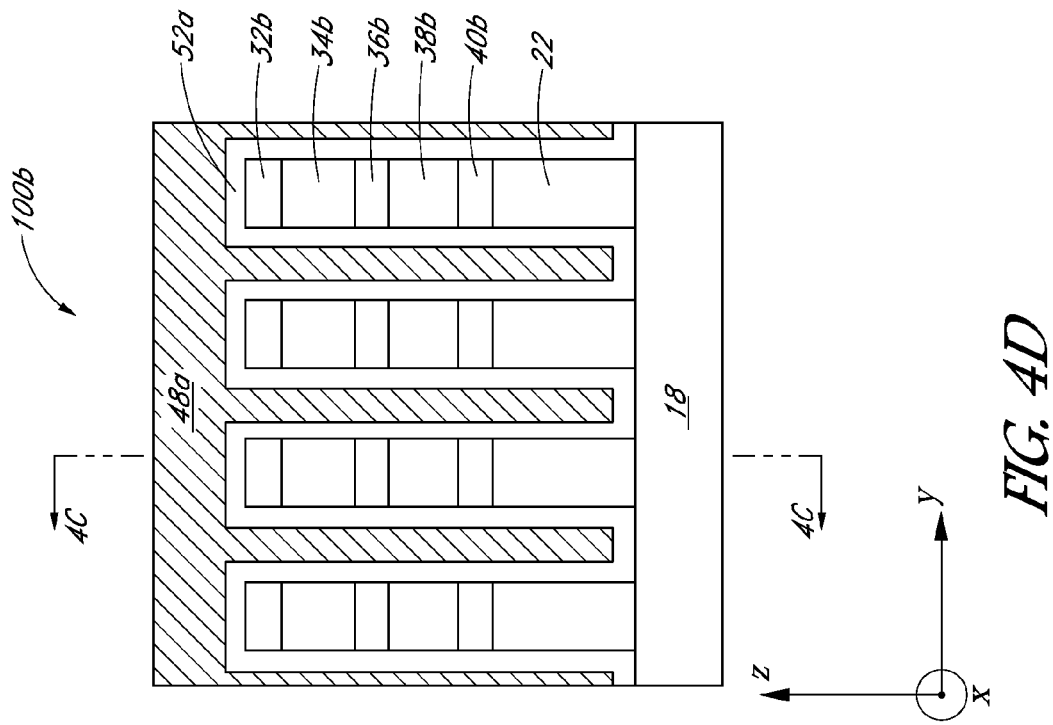
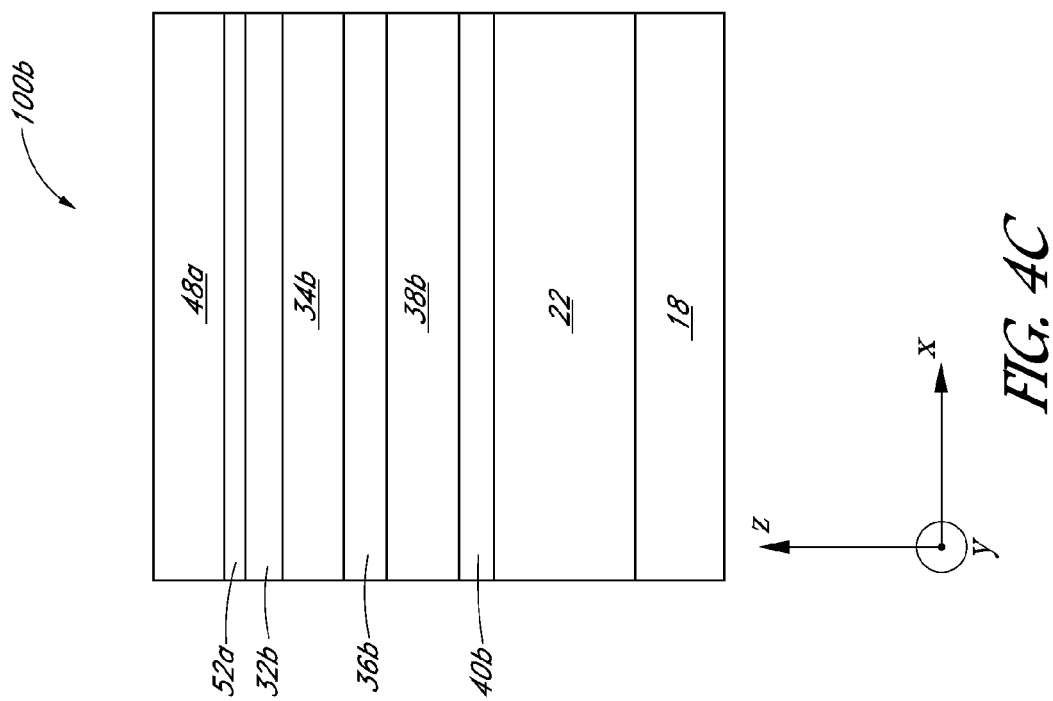
FIG. 4D
FIG. 4C

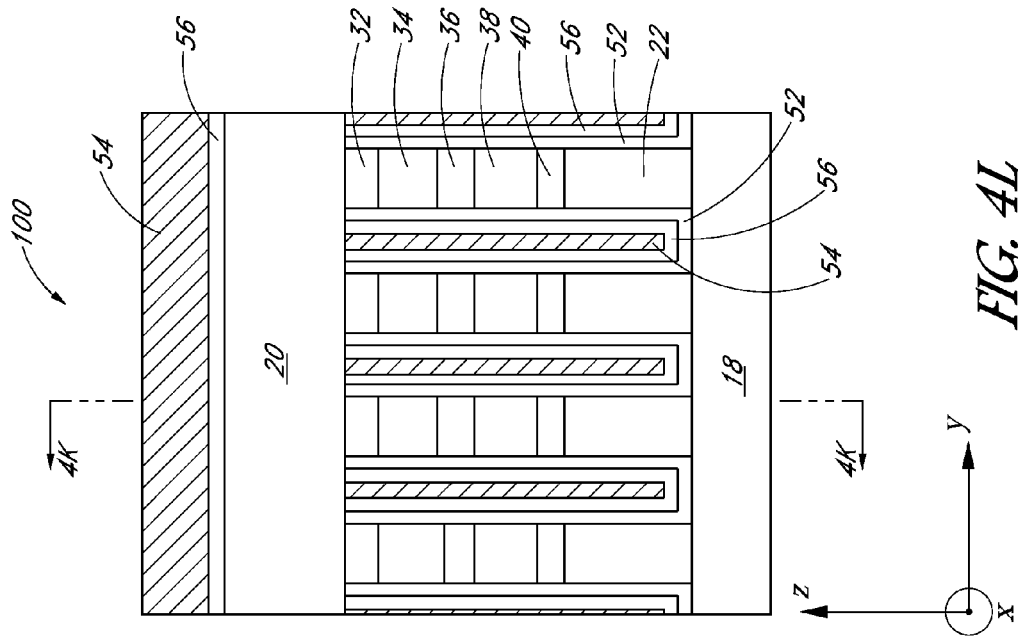
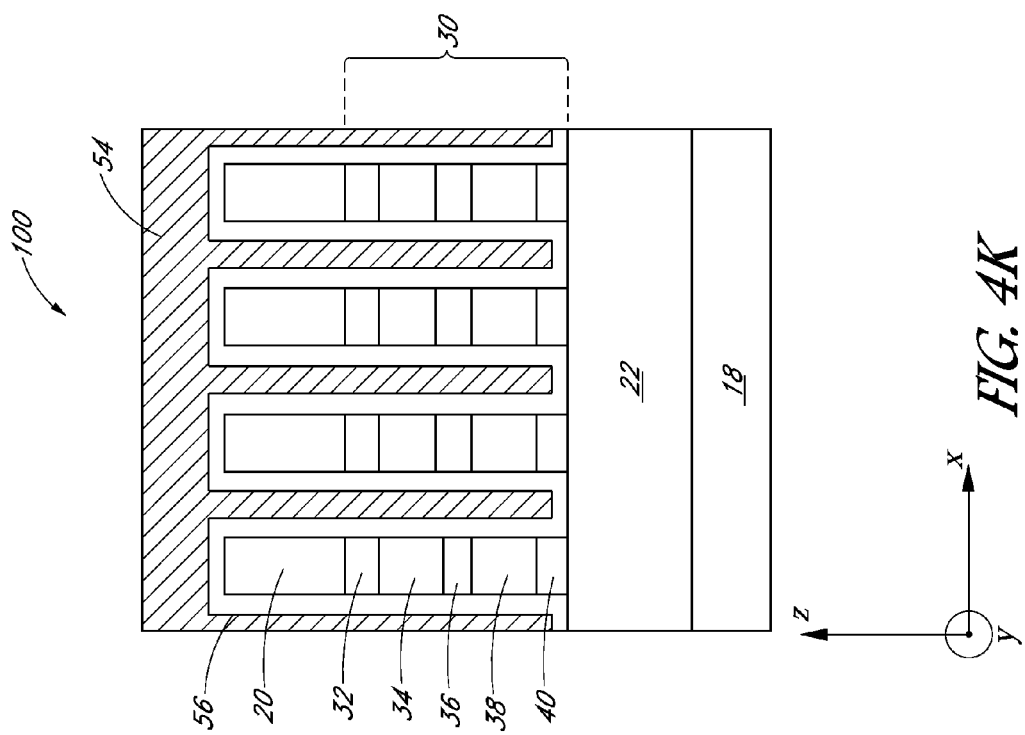
FIG. 4L
FIG. 4K

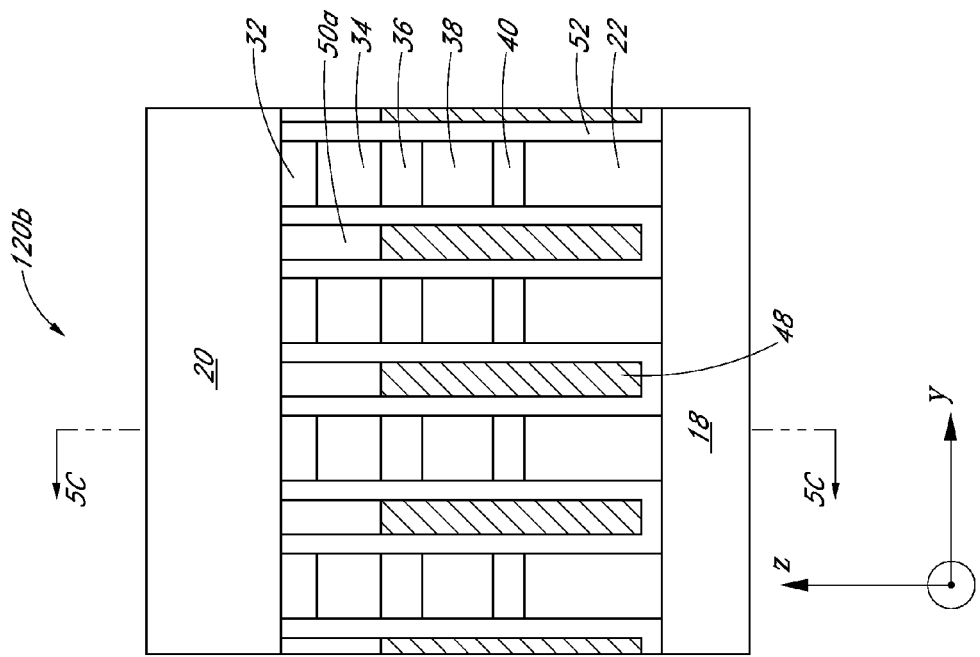
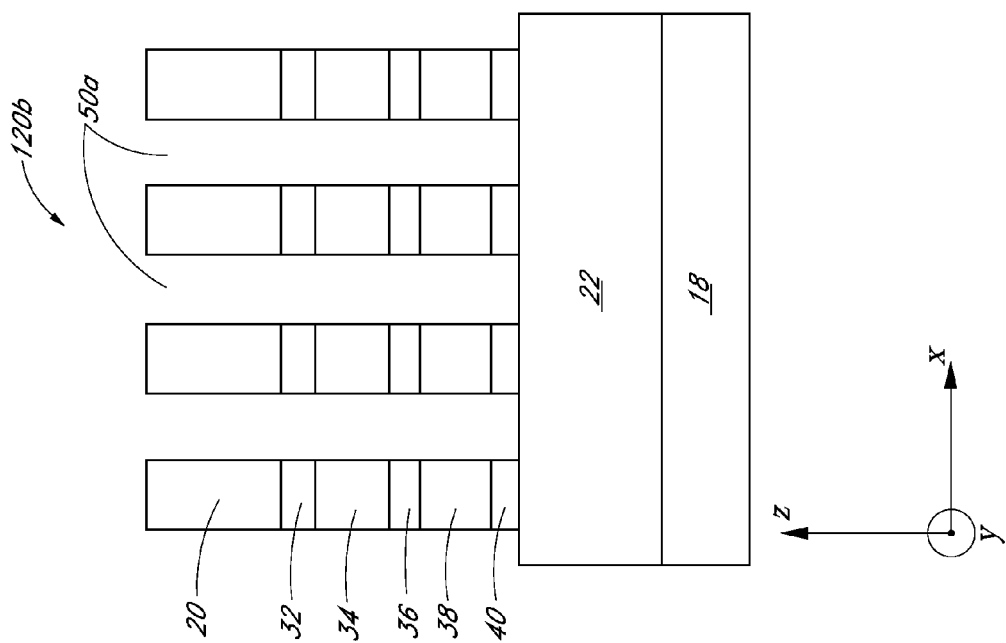
FIG. 5D
FIG. 5C

CROSS-POINT MEMORY AND METHODS FOR FABRICATION OF SAME

BACKGROUND

Field

The disclosed technology generally relates to integrated circuit devices, and in particular to cross-point memory arrays and methods for fabricating the same.

Description of the Related Art

Some memory devices include memory cells that can switch by changing their resistance state in response to an electrical signal, such as a voltage or a current pulse. Such memory cells, sometimes called variable resistance memory cells, include active elements that include variable resistance materials, whose electrical resistance can be changed by the electrical signal. In some variable resistance change materials, the change in electrical resistance can be accompanied by generation of heat. One category of such variable resistance materials is phase change materials, whose change in resistance can be associated with generation of heat during switching. The heat generated during switching of a memory cell can induce adverse effects on neighboring cells, such as thermal disturbance, whose effects become more pronounced as the memory cells are scaled in dimensions. Thus, there is a need to reduce the adverse effects of the heat on the neighboring memory cells in memory devices that include variable resistance materials.

BRIEF DESCRIPTION OF THE DRAWINGS

Claimed subject matter is particularly pointed out in the concluding portion of the specification. However, organization and/or method of operation, together with certain objects, features, and/or advantages thereof, may be better understood by reference to the following detailed description if read with the accompanying drawings in which:

FIG. 2A is a schematic vertical cross section of a memory array including phase change materials, taken in a first direction parallel to a lower conductive line, according to some embodiments.

FIG. 2B is a schematic vertical cross section of the memory array of FIG. 2A, taken in a second direction perpendicular to the first direction and parallel to an upper conductive line, according to some embodiments.

FIGS. 4A, 4C, 4E, 4G, 4I and 4K are schematic vertical cross sections of intermediate structures a memory array including phase change materials at various stages of fabrication, taken in a first direction parallel to a lower conductive line, according to some embodiments.

FIGS. 4B, 4D, 4F, 4H, 4J and 4L are schematic vertical cross sections of the intermediate structures corresponding to FIGS. 4A, 4C, 4E, 4G, 4I and 4K, respectively, taken in a second direction perpendicular to the first direction and parallel to an upper conductive line, according to some embodiments.

FIGS. 5A, 5C and 5E are schematic vertical cross-sections of intermediate structures a memory array including phase change materials at various stages of fabrication, taken in a first direction parallel to a lower conductive line, according to some other embodiments.

FIGS. 5B, 5D and 5F are schematic vertical cross sections of the intermediate structures corresponding to FIGS. 5A, 5C and 5E, respectively, taken in a second direction perpendicular to the first direction and parallel to an upper conductive line, according to some other embodiments.

Figure 1B:
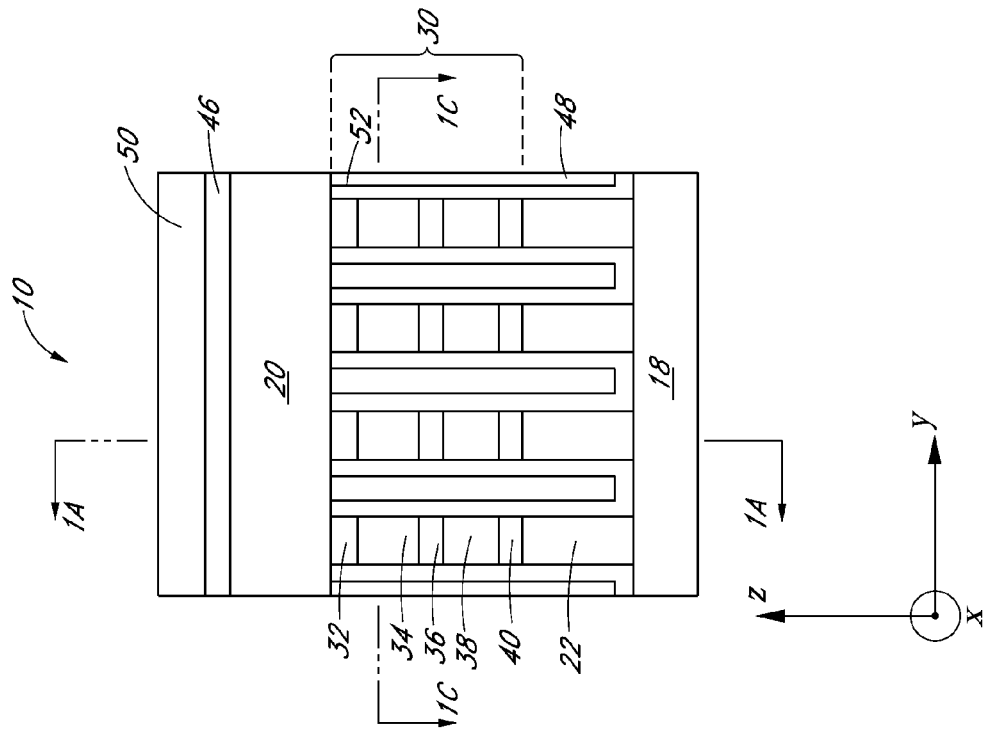
FIG. 1B is a schematic vertical cross section of the memory array of FIG. 1A, taken in a second direction perpendicular to the first direction and parallel to an upper conductive line.

Features in the drawings are not necessarily drawn to scale and may extend in different directions from that illustrated. While various axes and directions are illustrated to facilitate the discussion herein, it will be appreciated that the features may extend in different directions.

DETAILED DESCRIPTION

Some memory devices include memory cells that can switch by changing their resistance state in response to an electrical signal, such as a voltage or a current pulse. Such memory cells, sometimes called variable resistance memory cells, include active elements that include variable resistance materials, whose electrical resistance can be changed by the electrical signal. One category of variable resistance materials is phase change materials, whose change in resistance state is associated with changes in the phase of the phase change materials between crystalline and amorphous states. The change in phase of the phase change materials can be accompanied by generation of heat. The heat generated during switching of a memory cell can induce adverse effects on neighboring cells, such as thermal disturbance, whose effects become more pronounced as the memory cells are scaled in dimensions.

In some memory devices, the variable resistance memory cells are arranged in a cross-point array configuration. Generally, a cross-point memory array refers to a memory array having memory elements disposed and electrically connected at intersections between a first set of conductive lines (e.g., word lines) and a second set of conductive lines (e.g., digit lines) overlapping and crossing the first set of conductive lines. The electrical resistance of the variable resistance materials of the cross-point memory array, e.g., phase change materials, can be changed by the electrical signals provided through the first and second conductive lines connected to the variable resistance materials.

Figure 1A:
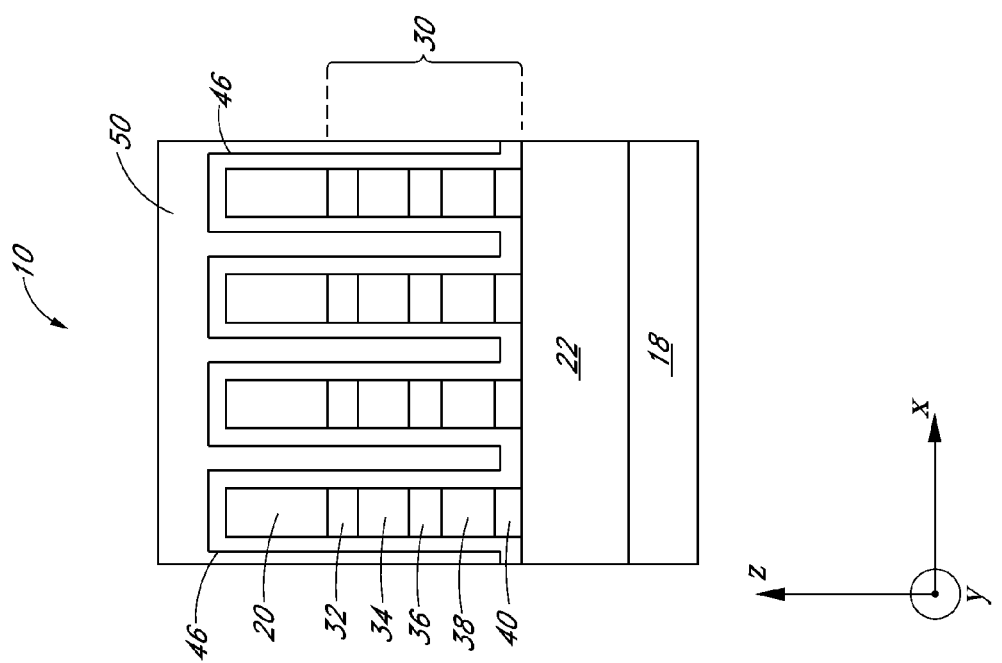
FIG. 1A is a schematic vertical cross section of a memory array including phase change materials, taken in a first direction parallel to a lower conductive line.
Figure 1C:
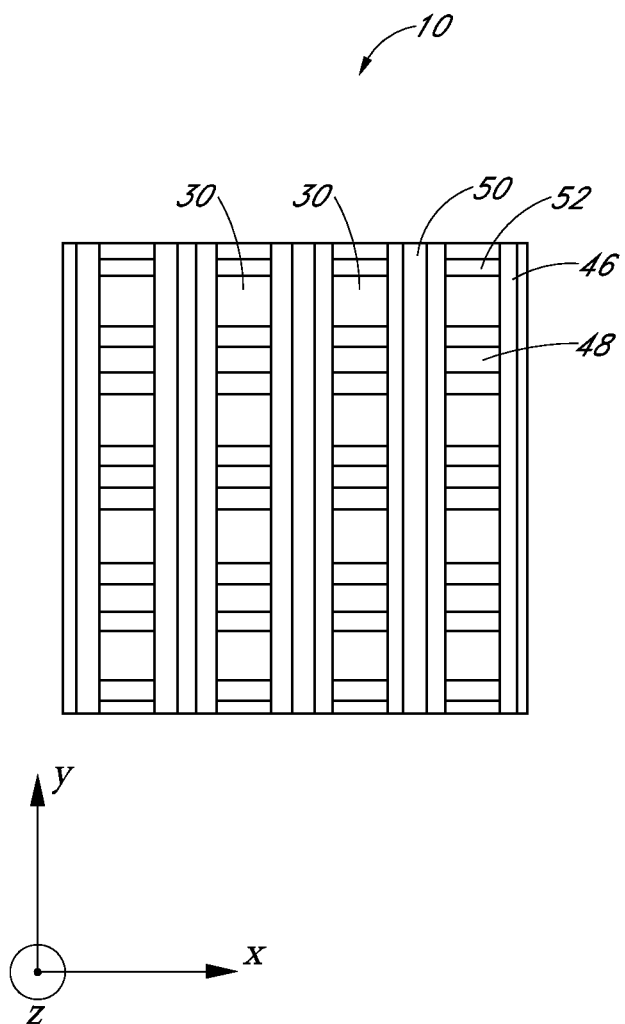
FIG. 1C is a schematic horizontal cross section of the memory array of FIGS. 1A and 1B, taken in a third direction perpendicular to the first and second directions and parallel to the underlying substrate surface.

FIGS. 1A-1C illustrate an example of a cross-point memory array 10 having a substrate 18 and a plurality of memory cells 30 formed thereon, viewed in a y-direction, an x-direction, and a z-direction, respectively. Referring to FIGS. 1A and 1B, each of the memory cells 30 is a variable resistance memory cell, e.g., a phase change memory cell, arranged in a stacked configuration between an upper conductive line 20 extending in the y-direction and a lower conductive line 22 extending in the x-direction. The upper and lower conductive lines 20 and 22 are conductors configured to carry electrical signals such as, for example, a voltage or a current pulse, between memory cells 30 and peripheral circuitry such as driver circuitry and sensing circuitry (not shown). The memory cell 30 includes a first active element 38, e.g., a selector element, and a second active element 34, e.g., a storage element, and in the illustrated embodiment these elements are separated by a middle electrode 36. The illustrated memory cell 30 additionally includes a lower electrode 40 between the first active element 38 and the lower conductive line 22 and an upper electrode 32 between the upper conductive line 20 and the second active element 34.

Referring to FIG. 1A, opposing sidewalls (in the x-direction) of the upper conductive line 20 and first opposing sidewalls (in the x-direction) of the memory cell 30 are lined with a first sealing material 46, and spaces between adjacent upper conductive lines 20 and spaces between adjacent memory cells 30 are filled with a first isolation material 50. Referring to FIG. 1B, opposing sidewalls (in the y-direction) of the lower conductive line 22 and second opposing sidewalls (in the y-direction) of the memory cell 30 are lined with a second sealing material 52, and spaces between adjacent lower conductive lines 22 and spaces between adjacent memory cells 30 are filled with a second isolation material 48. Referring to the horizontal cross section of FIG. 1C, the first sealing material 46 extends in the y-direction to traverse a plurality of memory cells 30 such that sidewalls of the plurality of memory cells 30 are lined and interconnected by a continuous first sealing material 46. In contrast, the second sealing material 52 extends in the x-direction to line sidewalls of individual memory cells 30 but does not interconnect a plurality of memory cells 30. The sealing materials 46 and 52 can function, during operation and/or processing, to minimize cross-contamination and/or material inter-diffusion between various elements of the memory cell 30 and surrounding materials, e.g., neighboring memory cells and isolation materials.

When the memory cells 30 are phase change memory cells, the temperatures of the first active element 38 and/or the second active element 34 of an accessed memory cell can be raised substantially above room temperature. The accessed memory cell, whose peak temperature can reach several hundred degrees, can have detrimental effects on the neighboring cells due to thermal diffusion. For example, the temperatures of the neighboring memory cells can result in degradation in data retention and disturbance. Sealing materials similar to the first sealing material 46 (FIGS. 1A and 1C) that commonly envelope multiple memory cells 30 in a direction (e.g., y-direction) can thermally connect the cells along that line, and result in a faster diffusion of heat in the direction compared to a direction (e.g., x-direction) in which the memory cells 30 are not interconnected by a common sealing material. Without being limited by theory, it is believed that heat may more easily transmit along interfaces between the two different sealing materials 46 and 52.

In the following, various embodiments relating to memory devices and methods of forming the memory devices are disclosed, which can advantageously include continuous sealing materials surrounding each memory cell. The inventors have found the various embodiments to substantially reduce and/or equalize transference of heat from one memory cell to surrounding regions of the memory cell.

The term "continuous," as used herein to describe materials such as sealing layers or isolation materials, characterizes a material that does not have gaps or interfaces formed within the material, such as may be the case when a deposition process is performed in multiple steps, or interrupted by an intervening process. In addition, the term "uniform material," as used herein to describe materials such as sealing layers or isolation materials, characterizes a material that does not have substantial disparities within the material, such as may be the case when a material, while connected, may be performed in multiple steps, or interrupted by an intervening process. For example, a material that is formed in two separate deposition steps and/or intervened by another process step can be discontinuous and/or nonuniform if it has identifiable interfaces within the material, even if the material as a whole is formed of similar or same materials. For example, even if both of the sealing materials 46 and 52 described above with respect to FIGS. 1A-1C are formed of silicon dioxide materials, the resulting combination of the sealing materials do not form a continuous and uniform sealing material, due to at least one intervening process which creates seams at interfaces formed by the sealing materials 46 and 52. Such seam may be detected, for example, by staining with a dilute hydrofluoric acid, such as that which may be used in the industry to enhance electron microscopy images. Uniform material does not imply a uniform thickness.

Figure 2C:
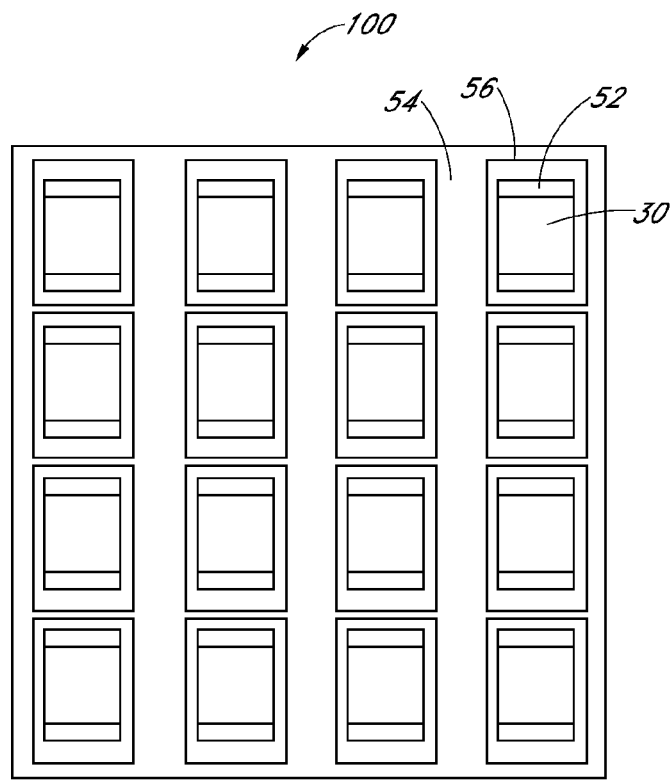
FIG. 2C is a schematic horizontal cross section of the memory array of FIGS. 2A and 2B, taken in a third direction perpendicular to the first and second directions and parallel to the underlying substrate surface, according to some embodiments.

FIGS. 2A, 2B and 2C are cross-sectional depictions of a cross-point memory array 100 having a plurality of memory cells 30, viewed in a y-direction, an x-direction, and a z-direction, respectively, according to some embodiments. Referring to FIGS. 2A and 2B, each of the memory cells 30 is a variable resistance memory cell, e.g., a phase change memory cell, arranged in a stacked configuration. In the illustrated embodiment, the memory cell 30 includes a relatively narrow stack which forms a memory cell pillar formed at an intersection between a lower conductive line 22 and an upper conductive line 20. The memory cell 30 comprises a first active element 38 disposed over the lower conductive line 22 and a second active element 34 disposed over the first active element 38. One of the first and second active elements 38 and 34 comprises a storage material and the other of the first and second active materials comprises a selector material. In embodiments where the memory cells 30 is a phase change memory cell, at least one of the first and the second active elements 38 and 34 can include a chalcogenide material that is configured to switch between crystalline and amorphous phases via an electrical pulse applied between one of the lower conductive lines 22 and one of the upper conductive lines 20 during an access operation. The memory cell 30 can additionally include one or more of a lower electrode 40 interposed between the lower conductive line 22 and the first active element 38, a middle electrode 36 interposed between the first active element 38 and the second active element 34, and an upper electrode 32 interposed between the upper conductive line 20 and the second active element 34. When included, one or more of the electrodes 40, 36 and 32 can include a material, such as carbon, that can serve simultaneously as an electrode material that can provide relatively low contact resistance between adjacent materials, as well as a diffusion barrier against intermixing, e.g., between metal lines and chalcogenide elements, or between chalcogenide elements of different compositions. Thus, in the illustrated embodiment, a memory cell 30 forming a pillar includes a stack comprising the lower electrode 40, the first active element 38, the middle electrode 36, the second active element 32 and the upper electrode 32. In other embodiments one or both of the upper and lower electrodes can be patterned in lines coextensive with the adjacent upper or lower conductive line.

The memory array 100 further includes a continuous sealing material 56 laterally surrounding each of the memory cell pillars of the memory cell 30, which includes the first and second active elements 38 and 34 in the illustrated embodiment (FIGS. 2A, 2B and 2C). The memory array 100 further includes initial sealing materials 52 formed on sidewalls of each of the memory cell pillars that are opposing each other in the y-direction, as illustrated in FIGS. 2B and 2C. The initial sealing materials 52, however, are not formed on sidewalls of the memory cell pillars that are opposing each other in the x-direction and, as best seem from FIG. 2C, the sealing material 56 further encloses the initial sealing materials 52 formed on the opposing sidewalls of the memory cell pillars in the y-direction. Unlike the first sealing material 46 described above with respect to FIGS. 1A and 1C that interconnect multiple memory cells 30 in a direction (e.g., y-direction), the sealing material 56 of FIGS. 2A-2C does not interconnect multiple memory cells 30 such that a disparity of heat diffusion in one direction (e.g., y-direction) compared to another direction (e.g., x-direction) described above with respect to FIGS. 1A-1C may be much less pronounced, or practically non-existent from the stand point of detrimentally affecting neighboring memory cells while accessing a target memory cell. For example, when the second active element 34 is the storage element of a phase change memory cell, the sealing material 56 laterally encloses the storage element in both first and second directions such that during an access operation of a target storage element, the temperatures of an adjacent neighboring storage element in the x-direction are substantially the same as the temperature of an adjacent neighboring storage element in the y-direction.

Furthermore, referring to FIG. 2A, the continuous sealing material 56 of the illustrated embodiment continuously covers top and side surfaces of the upper conductive lines 20 that are opposing in the x-direction, opposing sidewalls of the memory cell 30 in the x-direction, and top surfaces of the lower conductive line 22 that are disposed between adjacent memory cells 30. In the illustrated embodiment, the sealing material 56 is in contact with the side surfaces of the memory cell 30 that are opposing in the x-direction.

Referring to FIG. 2B, the initial sealing material 52 continuously covers side surfaces of the upper conductive lines 20 and of the memory cells 30 that are opposed in the y-direction, and top surfaces of the substrate 18 that are disposed between adjacent lower conductive lines 22. It will be understood that the term "substrate" as used herein encompasses bulk semiconductor substrates as well as any integrated layers formed thereon. In addition, the continuous sealing material 56 continuously covers the initial sealing material 52, such that the continuous sealing material 56 does not directly contact the sidewalls of the memory cells 30 and of the lower conductive lines 22 that are opposed in the y-direction. In other embodiments, the initial sealing material is omitted and the continuous sealing material continuously covers and contacts side surfaces of the upper conductive lines and of the memory cells that are opposing in the y-direction, and top surfaces of the substrate that are disposed between adjacent lower conductive lines.

Still referring to FIG. 2B, the continuous sealing material 56 is formed directly on the sealing material 52 over an entire surface of the sealing material 52. Other embodiments are possible such as, for example, embodiments illustrated in FIGS. 5A-5F and described below, where the continuous sealing material 56 is formed directly on the first sealing material 52 at an upper portion of the memory cell 30, while not formed directly on the sealing material 52 at a lower portion of the memory cell 30. In these embodiments, the second active material 34 at the upper portion of the memory cell 30 may be a storage material of a phase change memory cell, which may be more susceptible to thermal disturbance, while the first active material 38 at the lower portion of the memory cell 20 may be a selector material of the phase memory cell which may be less susceptible to thermal disturbance.

Referring to FIG. 2C, each initial sealing material 52 extends in the x-direction to line a sidewall of a single memory cell 30, similar to the second sealing material 52 described above with respect to FIG. 1C. However, unlike the first sealing material 46 of FIG. 1C, the continuous sealing material 56 does not extend in the y-direction to contact a plurality of memory cells 30. Instead, each continuous sealing material 56 surrounds an individual memory cell 30, and in the illustrated embodiment, the sealing material 56 contacts sidewalls of the memory cells 30 that are opposing in the x-direction, while not directly contacting sidewalls of the memory cells 30 that are opposing in the y-direction due to the presence of the initial sealing material 52 interposed between the sidewalls of the memory cells 30 and the continuous sealing material 56. In embodiments where the initial sealing materials 52 are omitted, each continuous sealing material 56 surrounds individual memory cell 30 to contacts all sidewalls of the memory cells 30.

Figure 2D:
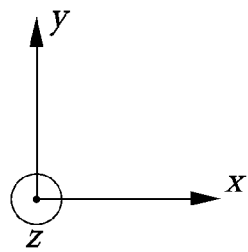
FIG. 2D is an enlarged view of one of the memory cell stacks of FIG. 2C.
Figure 2D:
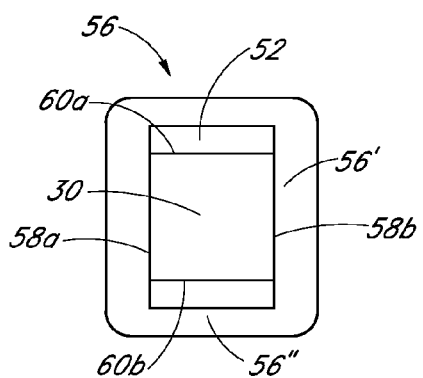

FIG. 2D is an enlarged view of a memory cell similar to an individual memory cell 30 of FIG. 2C, according to some embodiments. The continuous sealing material 56 surrounds the individual memory cell, and the continuous sealing material 56 contacts first sidewalls 58a and 58b of the individual memory cell that are opposing in the x-direction, while not directly contacting sidewalls 60a and 60b of the individual memory cell that are opposing in the y-direction. In the illustrated embodiment, portions 56' of the continuous sealing material 56 on the first sidewalls 58a and 58b are thicker relative to portions 56" of the continuous sealing material 56 over the second sidewalls 60a and 60b. The different thicknesses between the portions 56' and the portions 56" can result, for example, due to the presence of the upper conductive lines 20, resulting in a "shadowing effect," when the continuous sealing material 56 is formed. This effect can be more pronounced, for example, when the continuous sealing material 56 is formed, for example, using deposition techniques such as chemical vapor deposition (CVD), including plasma enhanced CVD (PECVD), which can result in less conformal coverage compared to techniques such as, for example, atomic layer deposition (ALD).

Figure 2E:
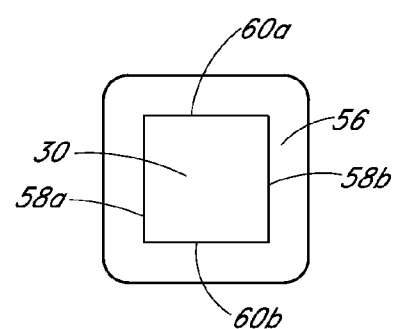
FIG. 2E is an enlarged view of a memory cell stack similar to FIG. 2D in accordance with an alternate embodiment.

FIG. 2E is an enlarged view of a memory cell similar to the memory cell of FIG. 2D in accordance with an alternative embodiment. Similar to the memory cell 30 of FIG. 2D, the continuous sealing material 56 surrounds the individual memory cell. In the illustrated embodiment, unlike the memory cell of FIG. 2D, however, the initial sealing material 52 is omitted. The continuous sealing material 56 contacts first sidewalls 58a and 58b of the individual memory cell that are opposing in the x-direction, and further contacts second sidewalls 60a and 60b of the individual memory cell that are opposing in the y-direction. Furthermore, in the illustrated embodiment, the continuous sealing material 56 has a uniform thickness on the first sidewalls 58a and 58b as well as on the second sidewalls 60a and 60b, such that the continuous sealing material 56 is also uniformly thick on all sidewalls of the memory cell. In the illustrated embodiment, even though the upper conductive lines 20 are present when the continuous sealing material 56 is formed, the continuous sealing material 56 can still be uniform in thickness when, for example, the continuous sealing material 56 is formed using deposition techniques such as ALD, which employs self-limiting or saturated deposition in each cycle and can result in more conformal coverage compared to techniques such as, for example, CVD, despite the shadowing effect.

Thus, it will be appreciated that unlike FIGS. 1A-1C, the sealing materials 52 and 56 of FIGS. 2A-2C, in addition to functioning to minimize cross-contamination and/or material inter-diffusion among various elements of the memory cell 30 and surrounding materials as described above with respect to FIGS. 1A-1C, also function to reduce or minimize disparity in heat transfer from a target cell that is being accessed to neighboring memory cells.

In some embodiments, at least one of the initial sealing material 52 and the continuous sealing material 56 can include a suitable dielectric material adapted to protect various portions of the sidewalls of the memory cell 30 during processing while minimizing thermal communication between adjacent memory cells 30. The initial sealing material 52 and the sealing material 56 can include oxide or nitride materials, such as silicon oxide (e.g., $SiO_2$), aluminum oxide (e.g., $Al_2O_3$) and silicon nitride (e.g., $Si_3N_4$), among others.

In addition, in some embodiments, one or both of the initial sealing material 52 and the continuous sealing material 56 can be advantageously selected to have thicknesses in a range between about 1 nm and about 10 nm, between about 2 nm and about 8 nm, or between about 3 nm and about 7 nm, for example about 5 nm. In other embodiments, one or both of the initial liner sealing material 52 and the sealing material 56 can advantageously selected to have thicknesses selected be in a range between about 5% and about 25%, or between about 10% and about 20%, of the width of the spaces formed between adjacent memory cells 30.

Still referring to FIGS. 2A-2C, the memory array 100 further comprises a continuous isolation material 54 surrounding the continuous sealing material 56, according to some embodiments. In some embodiments, the isolation material 54 may comprise a dielectric material different than the initial sealing material and the continuous sealing material. The isolation material 54 can include oxide or nitride materials, such as silicon oxide (e.g., $SiO_2$), aluminum oxide (e.g., $Al_2O_3$) and silicon nitride (e.g., $Si_3N_4$), among others. It will be appreciated that, in contrast to FIGS. 1A-1C, adjacent memory cells 30 in FIGS. 2A-2C are interposed in both x and y directions by the isolation material 54 that comprises a single continuous material.

Various elements of the memory cell 30 are now described in more detail, according to various embodiments. Referring to FIGS. 2A-2C, upper and/or lower conductive lines 20 and 22 can comprise a metal. Examples of the metal include elemental metals such as Al, Cu, Ni, Cr, Co, Ru, Rh, Pd, Ag, Pt, Au, Ir, Ta, and W; conductive metal nitrides such as TiN, TaN, WN, and TaCN; conductive metal silicides such as tantalum silicides, tungsten silicides, nickel silicides, cobalt silicides and titanium silicides; and conductive metal oxides such as $RuO_2$.

Still referring to FIGS. 2A-2C, examples the second active element 34, which can be a storage element, include a chalcogenide-based phase change storage element, a resistive random access memory (RRAM) storage element (e.g., NiO, $HfO_2$, $ZrO_2$, $Cu_2O$, $TaO_2$, $Ta_2O_5$, $TiO_2$, $SiO_2$, $Al_2O_3$), a conductive bridge random access memory (CBRAM) storage element (e.g., metal-doped chalcogenide), and/or a spin transfer torque random access memory (STT-RAM) storage element, among other types of storage elements.

Examples of the first active element 38, which can be a selector element, include a two terminal device (e.g., a switch), such as a diode, an ovonic threshold switch (OTS), a tunnel junction, or a mixed ionic electronic conduction switch (MIEC), among other two terminal devices.

In embodiments where the memory cell 30 is a phase change memory cell, one or both of the first and second active elements 38 and 34, which can be selector and storage elements, respectively, can comprise chalcogenide materials. When both storage and selector elements comprise chalcogenide materials, the storage element can comprise a chalcogenide material that can undergo a phase change that is nonvolatile at room temperature. On the other hand, the selector element can comprise a chalcogenide material that does not undergo a similar nonvolatile phase change.

In some embodiments, the storage element includes a chalcogenide material such as an alloy including at least two of the elements within the indium (In)-antimony (Sb)-tellurium (Te) (IST) alloy system, e.g., $In_2Sb_2Te_5$, $In_1Sb_2Te_4$, $In_1Sb_4Te_7$, etc., or an alloy including at least two of the elements within the germanium (Ge)-antimony (Sb)-tellurium (Te) (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other chalcogenide alloy systems.

In some embodiments, the selector element includes a chalcogenide material. A selector device having a chalcogenide material can sometimes be referred to as an Ovonic Threshold Switch (OTS). An OTS may include a chalcogenide composition including any one of the chalcogenide alloy systems described above for the storage element and, in addition, further include an element that can suppress crystallization, such as arsenic (As), nitrogen (N) and carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Still referring to FIGS. 2A-2C, the upper, middle and lower electrodes 32, 36 and 40 can comprise materials that electrically connect the operational elements of the memory cell but prevent interactions and/or interdiffusion among adjacent materials. For example, depending upon the adjacent materials, suitable electrode materials can include one or more conductive and semiconductive materials such as, for example, carbon (C); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$.

Still referring to FIGS. 2A-2C, in some embodiments, the upper and lower conductive lines 20 and 22 can have a lateral dimensions, e.g., widths, in x and y directions, respectively, selected to be in the range between about 5 nm and 60 nm, for example about 30 nm, in the range between about 5 nm and 40 nm, for example about 25 nm, or between about 5 nm and 30 nm, for example about 20 nm, depending upon the lithographic node for the integrated circuit design. Smaller dimensions are yet possible, limited only by the lithographic capability employed by the person skilled in the art. The upper and lower conductive lines 20 and 22 can have lengths in the y and x directions, respectively, selected to be much greater than the widths, such as at least 100 times greater or at least 1000 times greater than the widths.

In addition, in some embodiments, each element in the memory cell 30, including the first and second active elements 38 and 34, have lateral dimensions in both x and y dimensions that are each selected to be in the range between about 5 nm and 60 nm, for example about 30 nm, in the range between about 5 nm and 40 nm, for example about 25 nm, or between about 5 nm and 30 nm, for example about 20 nm, depending upon the lithographic node for the integrated circuit design.

Figure 3:
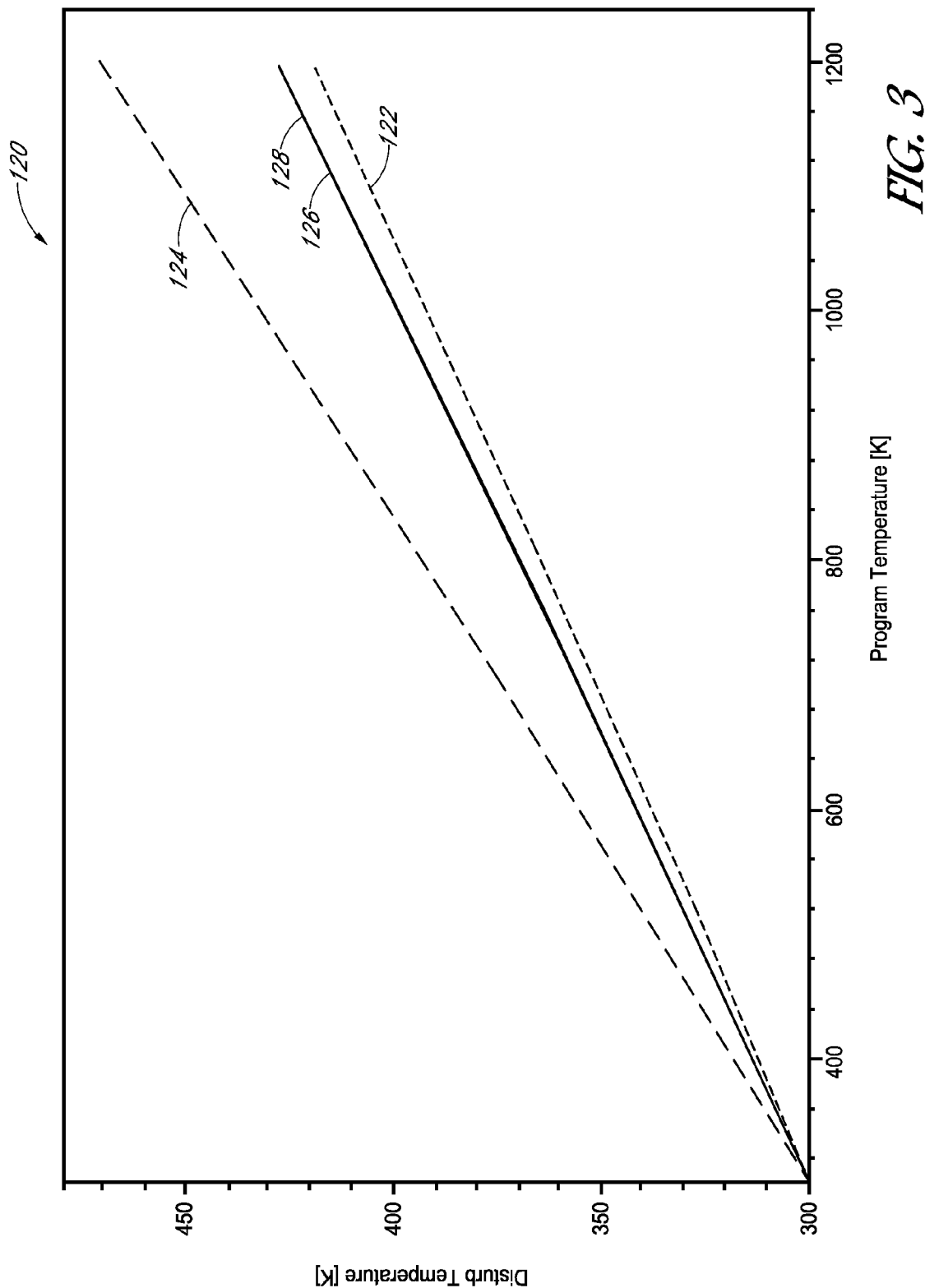
FIG. 3 is a graph showing calculated temperatures of neighboring memory cells including phase change materials, as a function of the temperature of a target memory cell, according to some embodiments.

FIG. 3 is a graph 120 showing calculated temperatures of neighboring memory cells as a function of the temperature of a memory cell during an access operation, according to some embodiments. The calculation corresponds to that of storage elements of phase change memory cells, similar to those described above with respect to FIGS. 1A-1C and FIGS. 2A-2C. As used herein, the memory cell being accessed may be called a "target cell." The x-axis represents the temperature of the storage element of the target memory cell, similar to the memory cell 30 described with respect to FIGS. 1A-1C and 2A-2C, that is being accessed in a programming operation, e.g., a SET operation or a RESET operation. As used herein, a SET operation refers to an operation which a target memory cell switches from a higher resistance state to a lower resistance state, which may be accompanied by a phase change of the storage element of the memory cell from a relatively amorphous state to a relatively more crystalline state. On the other hand, a RESET operation refers to an operation which the target memory cell switches from a lower resistance state to a higher resistance state, which may be accompanied by a phase change of the storage element of the memory cell from a relatively crystalline state to a relatively more amorphous state. As used herein, a SET operation refers to an access operation in which the target memory cell undergoes a change in resistance from a relatively high resistance state, e.g., RESET, state to a relatively low resistance state, e.g., SET state. A RESET operation refers to an access operation in which the target memory cell undergoes a change in resistance from a relatively low resistance state, e.g., SET state, to a relatively high resistance state, e.g., RESET state. The y-axis represents the temperature of storage elements of nearest neighboring memory cells, which can be memory cells adjacent the target cell in x (e.g., word line) or y (e.g., digit line) directions. The neighboring memory cell, whose temperature can increase as a result of the temperature of the target cell, can sometimes be called a "victim cell." The calculated temperatures of the storage elements of the neighboring memory cell in FIG. 3 represent steady-state temperatures.

Still referring to FIG. 3, the graph 120 shows calculated temperature curves 124 and 122 corresponding to storage elements of nearest neighboring memory cells in the y-direction (e.g., digit line direction) and in the x-direction (e.g., word line direction), respectively, for a memory array similar to the memory array 10 of FIGS. 1A-1C, in which a first sealing material 46 extends in the y-direction to interconnect sidewalls of a plurality of memory cells 30. As illustrated, the next nearest neighboring memory cell in the y-direction has a higher temperature compared to the next nearest neighboring memory cell in the x-direction, and the difference in temperature between the next nearest neighboring cells in the y and x directions becomes larger at higher temperatures of the target cell.

Still referring to FIG. 3, the graph 120 shows calculated temperature curves 126 and 128 corresponding to nearest neighboring memory cells in the y-direction (e.g., digit line direction) and the x-direction (e.g., word line direction), respectively, for a memory array similar to the memory array 100 of FIGS. 2A-2C, which includes a continuous sealing material 56 comprising a single layer that surrounds at least the upper portions of the memory cells that include storage elements. As illustrated, the calculated temperature curves 126 and 128 substantially coincide with each other throughout a temperature range between about 300° C. and about 1200° C., such that a nearest neighboring memory cells y- and x-directions have substantially the same temperatures, and that the difference in temperature between the next nearest neighboring cells in the x and y directions is less than about 10 degrees within the temperature range plotted. That is, the sealing material similar to the sealing material 56 of FIGS. 2A-2C does not interconnect multiple memory cells such that a disparity of heat diffusion in one direction compared to another direction is much less pronounced than that between the calculated temperature curves 122 and 124, or practically non-existent (e.g., within about 10° C.), from the stand point of detrimentally affecting neighboring memory cells while accessing a target memory cell. Moreover, the calculate temperature curves 126 and 128 are much lower than the curve 124, illustrating that thermal dispersion is retarded by the continuously surrounding sealing material 56 relative to the combination of sealing materials 52 and 46 in FIG. 1C, with its attendant interfaces.

In the following, methods of fabricating cross-point memory arrays similar to the cross-point memory array 100 of FIGS. 2A-2C according to various embodiments are described, wherein the memory arrays have continuous sealing materials surrounding at least storage elements formed at upper portions of the memory cell pillars. FIGS. 4A-4L illustrate cross-sectional views of a cross-point memory array at various stages in a sequence of fabrication, according to some embodiments.

As used herein and throughout the specification, "subtractive patterning" refers to a process sequence where structures to be defined are patterned by the removal of material. For example, a "subtractive patterning process" may include blanket provision of a material to be patterned, followed by lithographically providing etch mask structures overlapping areas to be patterned, followed by etching through the mask, such that materials in areas covered by the mask structures are protected while materials in exposed areas are removed by the etch removal process. In contrast to subtractive patterning, damascene patterning involves patterning voids in a first layer, blanket depositing material into the voids and over the remaining parts of the first layer, and polishing away the overburden from over the first layer to leave the material of interest patterned in the voids.

In the following, it will be understood that while only short segments of certain elongated structures such as segments of upper conductive lines and lower conductive lines may be illustrated, in practice such elongated structures may be much longer. In addition, while only a few parallel conductive lines and memory cells may be illustrated, in practice many parallel lines and memory cells may be formed to span a memory array.

In the following, FIGS. 4A, 4C, 4E, 4G, 4I and 4K represent cross-sectional views of intermediate array structures of a cross-point memory array at various stages of fabrication, viewed in a y-direction (e.g., a digit line direction), and FIGS. 4B, 4D, 4F, 4H, 4J and 4L represent cross-sectional views of the intermediate array structures corresponding to the intermediate structures of FIGS. 4A, 4C, 4E, 4G, 4I and 4K, respectively, viewed in an x-direction (e.g., a word line direction).

Figure 4B:
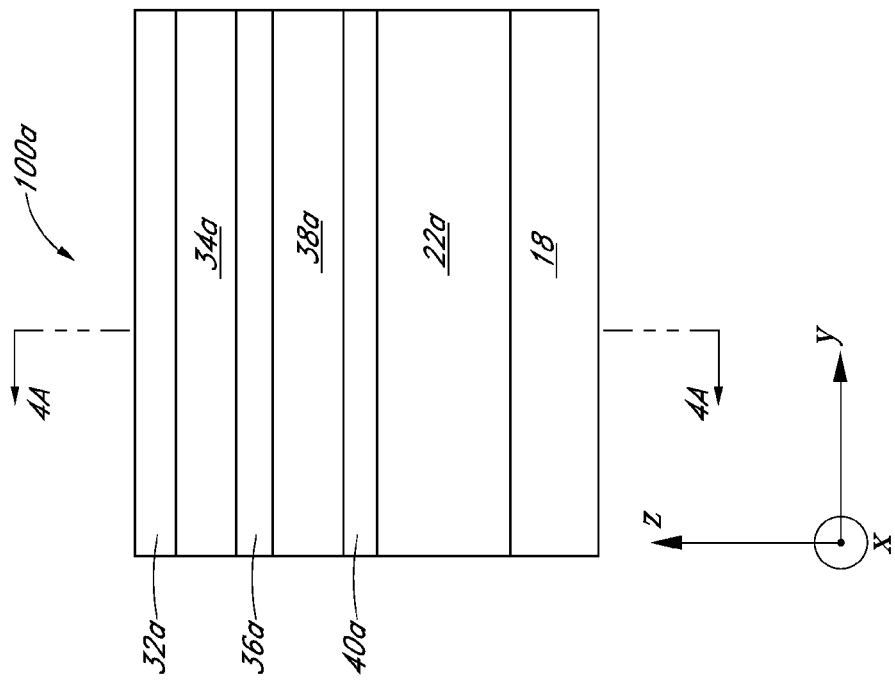
Figure 4A:
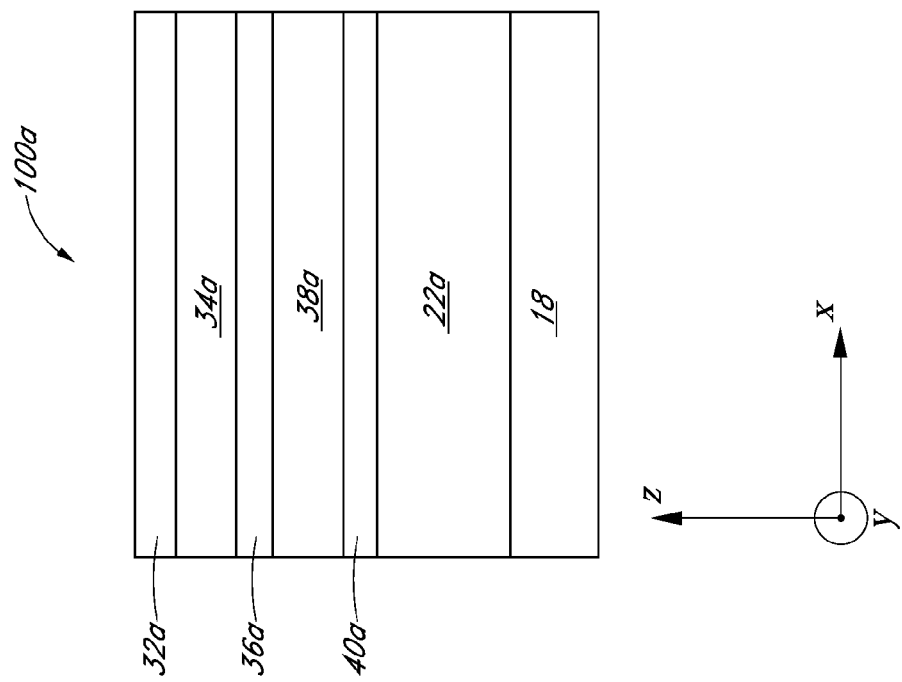

Referring to intermediate array structure 100a of FIGS. 4A and 4B, the method of fabricating a memory array includes forming a memory cell material stack on a substrate 18. The illustrated stack includes a lower conductive material 22a formed over the substrate 18, and the memory cell material stack is formed thereover, including a lower electrode material 40a on the lower conductive material 22a, a first active material 38a (e.g., a selector element material) on the lower electrode material 40a, a middle electrode material 36a on the selector element material 38a, a second active material 34a (e.g., a storage element material) on the middle electrode material 36a, and an upper electrode material 32a on the storage element material 34a. The foregoing features of the lower conductive material 22a and the memory cell material stack may be formed, for example, by deposition techniques such as physical deposition (PVD), chemical vapor deposition (CVD), and atomic layer deposition (ALD), among other deposition techniques. Each feature of FIGS. 4A and 4B may be formed as a blanket layer over an entire substrate 18, such as a wafer. Because the stack is unpatterned, it looks identical in both the y-direction view of FIG. 4A and the x-direction view of FIG. 4B.

It will be appreciated that at least one of features of the memory cell material stack of the intermediate structure 100a can be omitted and still have functional memory cells upon completion of fabrication. For example, one of the first or second active materials 38a or 34a can be omitted in some embodiments, where the omitted active material is a selector material. In addition, one or more of the lower electrode material 40a, the middle electrode material 36a and the upper electrode material 32a can be omitted in some embodiments.

Referring to intermediate array structure 100b of FIGS. 4C and 4D, the method of fabricating the memory array additionally includes subtractively patterning the memory cell material stack and the lower conductive material 22a (FIGS. 4A and 4B) to form a memory cell line stack on a lower conductive line 22, both extending in the x-direction. In some embodiments, the memory cell line stack and the lower conductive line 22 are patterned using a first photo mask and a first single etch process. The memory cell line stack includes a lower electrode line 40b on the lower conductive line 22, a first active element line 38b (e.g., a storage element line) on the lower electrode line 40b, a middle electrode line 36b on the first active element line 38b, a second active element line 34b (e.g., a storage element line) on the middle electrode line 36b, and an upper electrode line 32b on the second active element line 34b.

Still referring to intermediate array structure 100b of FIGS. 4C and 4D the method additionally includes, after forming the memory cell line stacks, forming initial sealing material 52a on sidewalls of the line stacks extending in the x-direction, as illustrated in FIG. 4D. The initial sealing material 52a can include suitable dielectric materials such as, for example, silicon oxide and silicon nitride, which may be deposited by a suitable deposition process such as chemical vapor deposition (CVD) and atomic layer deposition (ALD). CVD and ALD can deposit the initial sealing material 52a conformally, with ALD providing better conformality than CVD. Plasma-enhanced CVD (PECVD) can also provide relatively conformal deposition at low temperatures compatible with sensitive phase change materials like chalcogenide materials, which can migrate during processing at higher temperatures.

Still referring to intermediate array structure 100b of FIGS. 4C and 4D, inter-line spaces between adjacent memory cell line stacks are filled with a dielectric material to form initial isolation dielectric regions 48a. Suitable dielectric materials to fill the spaces can include, for example, silicon oxide and silicon nitride, which may be deposited by a suitable gap-filling process known in the art. In some embodiments, the dielectric materials of the initial isolation dielectric regions 48a are different from the dielectric material of the initial sealing material 52a. Once the inter-line spaces between adjacent memory cell line stacks are filled, the intermediate array structure 100b can be chemical-mechanically polished to stop on the upper electrode lines 32b, thus exposing a substantially planar surface (not shown) comprising alternating surfaces of the upper electrode lines 32b interposed by isolation dielectric regions 48a. Thus, in the illustrated embodiment, chemical-mechanically polishing forms the memory cell line stacks and initial isolation dielectric regions 48a that alternate in the y-direction.

Figure 4F:
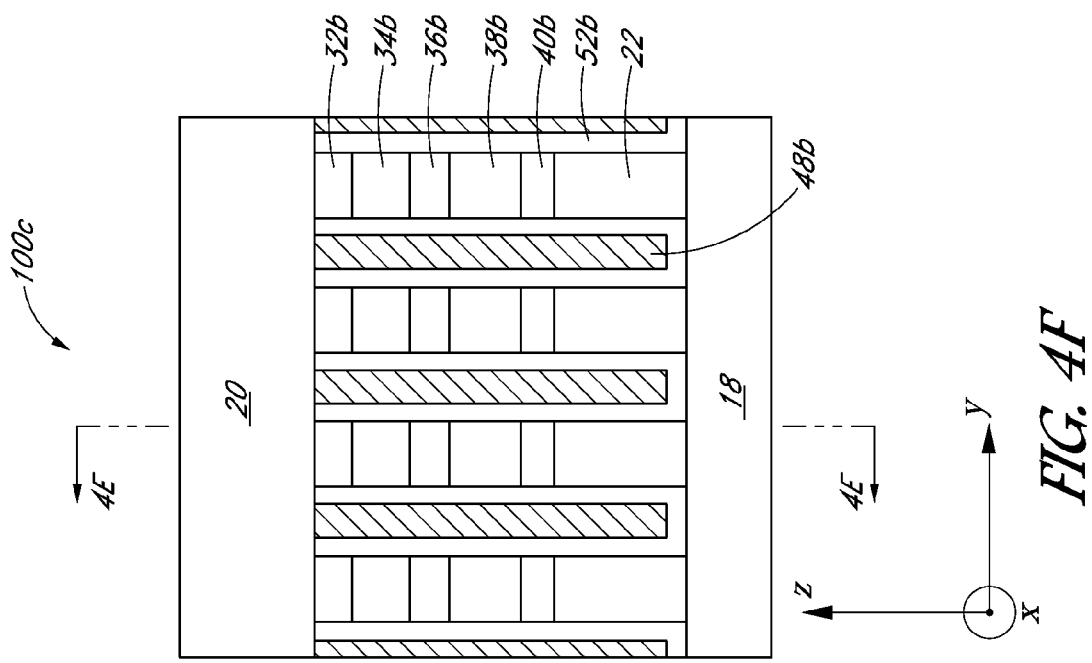
Figure 4E:
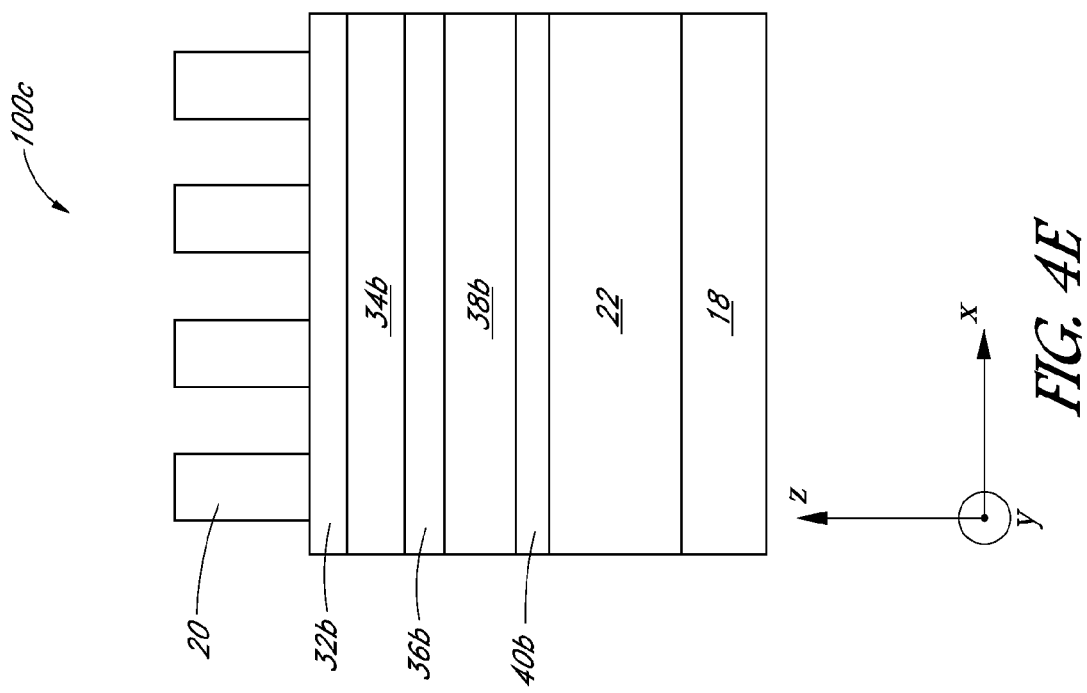

Referring intermediate array structure 100c of FIGS. 4E and 4F, the method of fabricating the memory array additionally includes depositing an upper conductive material (not shown) on the substantially planar surface and subtractively patterning using a second photo mask to form a plurality of upper conductive lines 20 extending in the y-direction. The upper conductive material can comprise similar or same material as the lower conductive line 22 and can be formed using substantially similar or same processes as discussed above for forming the lower conductive line 22. Thus formed, the plurality of upper conductive lines 20 are disposed on the alternating memory cell line stacks and the initial isolation dielectric regions 48b, wherein the upper conductive lines extend in the y-direction to cross the memory cell line stacks that extend in the x-direction. Forming the upper conductive lines 20 exposes portions of the upper electrode lines 32b of the alternating line stacks, as best seen from FIG. 4E, and portions of the initial isolation dielectric regions 48b between adjacent upper conductive lines 20. The upper conductive lines 20 intersecting the line stack form an overlapping region between the line stack and the upper conductive line.

Figure 4H:
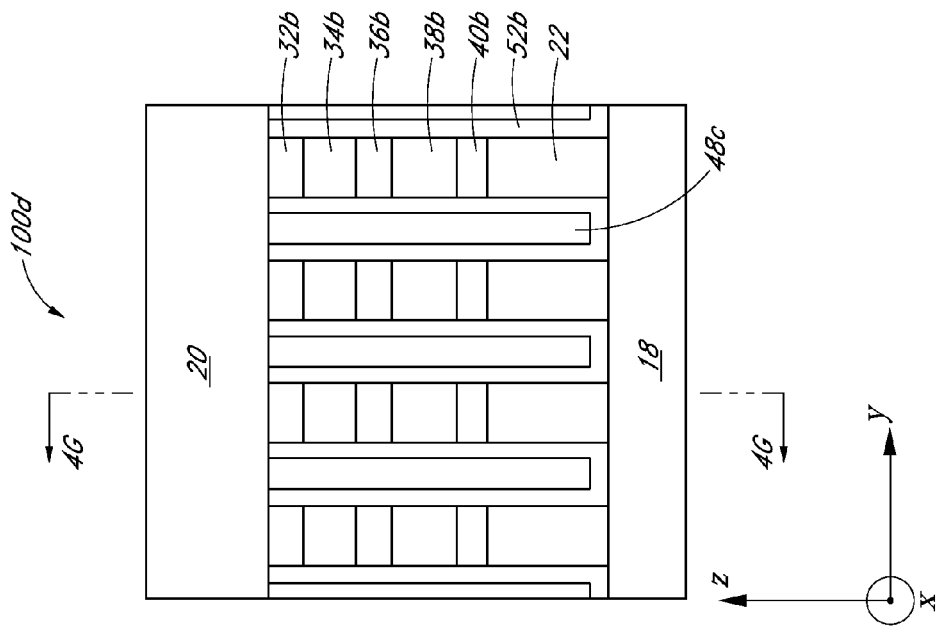
Figure 4G:
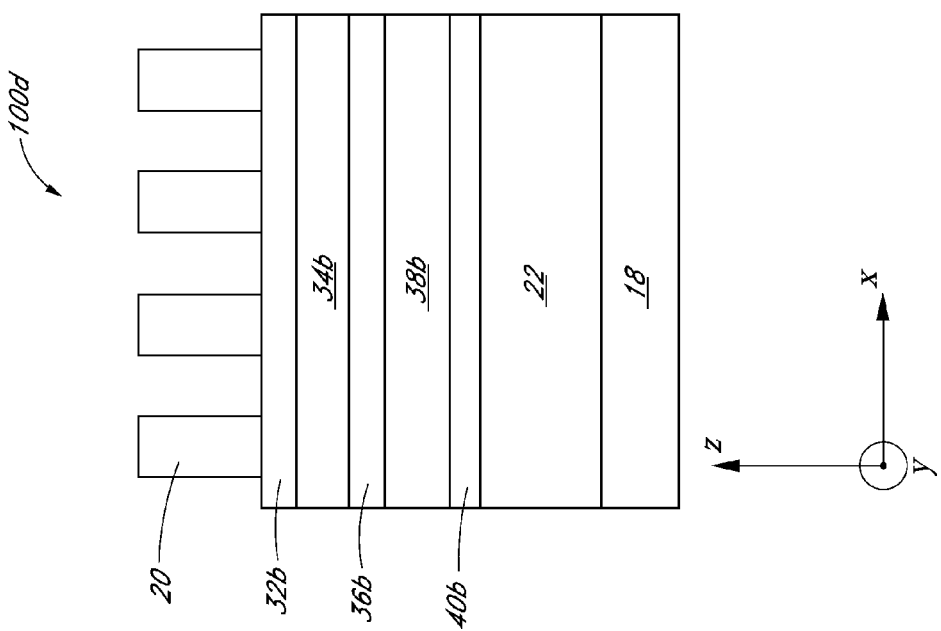

Referring to intermediate array structure 100d of FIGS. 4G and 4H, the method of fabricating the memory array additionally includes recessing to remove at least upper portions of the initial isolation dielectric materials from exposed portions of the initial isolation dielectric regions 48b to form spaces 48c. In the illustrated embodiment, entire initial isolation dielectric materials are removed from the initial dielectric regions 48b to form the spaces 48c. The initial isolation dielectric materials can be removed using, for example, wet or dry etching techniques that selectively remove the isolation dielectric materials while substantially leaving intact remaining structures, including the initial sealing material 52b. For example, in embodiments where the isolation dielectric regions 48b are formed of silicon dioxide and the initial sealing material 52b is formed of silicon nitride, an etchant including dilute hydrofluoric acid (HF) can selectively remove the isolation dielectric materials to form the spaces 48c.

Figure 4I:
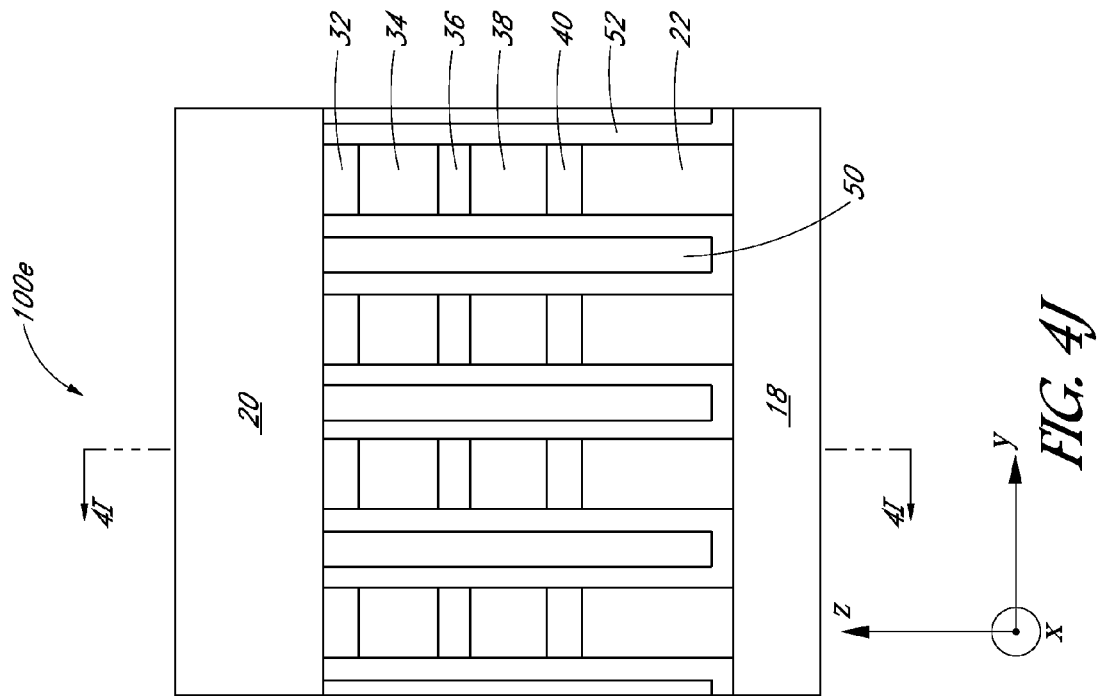
Figure 4J:
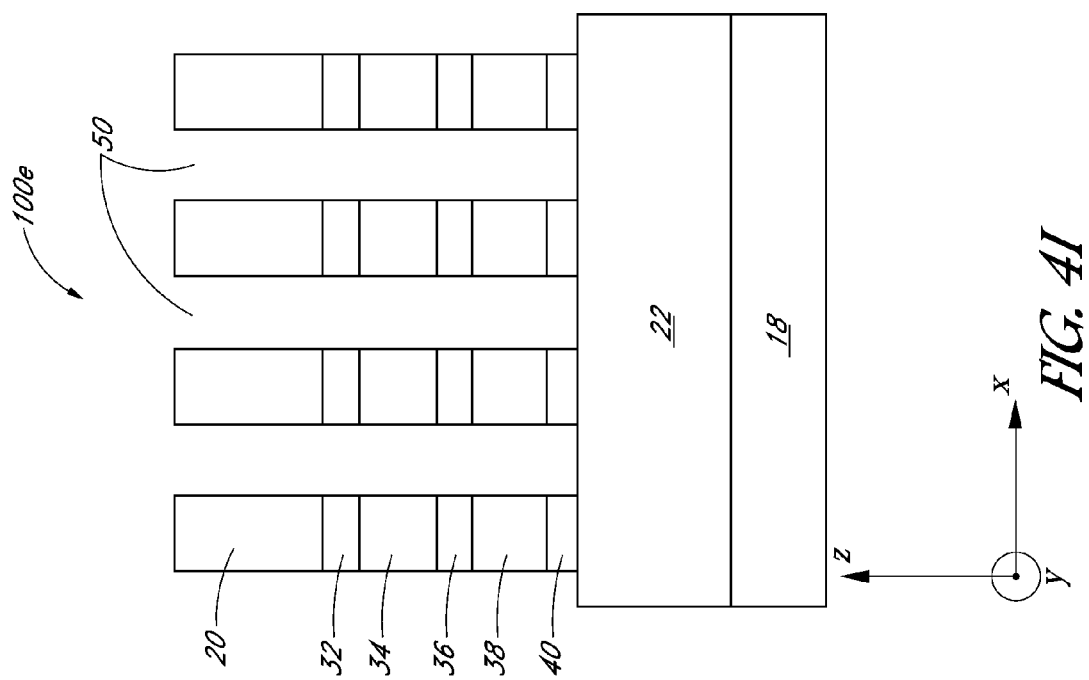

Referring to intermediate structure 100e of FIGS. 4I and 4J, after removing the initial isolation dielectric materials from the isolation dielectric regions 48b to form the spaces 48c, the method of forming the memory array further includes removing at least upper portions of the exposed portions of the memory cell line stacks of FIGS. 4G and 4H to form free-standing pillars at intersections of the lower conductive lines 22 and the upper conductive lines 20. In the illustrated embodiment of FIGS. 4I and 4J, entire exposed portions (upper and lower portions) of the memory cell line stacks are removed by stopping the etch at the lower conductive lines 22 (or at an etch stop layer thereover) such that the resulting free-standing pillar includes the upper electrode 32, the second active element 34 (e.g., a storage element), the middle electrode 36, the first active element 38 (e.g., a selector element), and the lower electrode element 40. In other embodiments, the etch can be stopped after etching any layer above the lower conductive lines 22 such that any one of the cell stack component layers, e.g., the lower electrode 40 or the first active element 38 can form a line similar to the lower electrode line 22. Thus, forming the free-standing pillars at intersections between the lower conductive lines 22 and the upper conductive lines 20 by removing the second active materials (e.g., storage materials) or both the second and first active materials (e.g., selector materials) from exposed portions of the memory cell line stacks of FIGS. 4G and 4H include forming the free-standing pillars that are laterally surrounded by spaces 50.

It will be appreciated that, because the upper conductive lines 20 using the second photo mask are formed prior to forming the free-standing pillars and can act as an etch mask (together with, for example, hard masks that may be on the upper conductive lines 20, not shown), forming the free-standing pillar can be performed without an additional photolithography process. Thus, the same pattern employed for the upper conductive lines 20 can also be used for etching pillars out of the memory cell line stacks. Between upper conductive lines 20, the etch removes exposed portions of the initial sealing material 52b as well as the materials of the memory cell line stacks.

Referring to intermediate array structure 100 of FIGS. 4K and 4L, after forming the free standing pillars between the lower and upper conductive lines 22 and 20, the method of forming the memory array includes forming a continuous sealing material 56 laterally surrounding upper portions of each of the free-standing portions. In the illustrated embodiment, the sealing material 56 laterally surrounds the entire free standing pillars (upper and lower portions) of the intermediate array structure 100e of FIGS. 4I and 4J, which includes the upper electrode 32, the second active element 34 (e.g., a storage element), the middle electrode 36, the first active element 38 (e.g., a selector element), and the lower electrode element 40. However, as described above with respect to FIGS. 4I and 4J, the sealing material 56 can be formed to surround a subset of these features, depending on where the etch process is stopped to form the free-standing pillar of the intermediate array structure 100e. In the illustrated embodiment, the sealing material 56 directly contacts sidewalls of the memory cell 30 that oppose each other in the x-direction, as best seen from FIG. 4K, while contacting the initial sealing material 52 on sidewalls of the memory cell 30 that oppose each other in the y-direction, as best seen from FIG. 4L. However, in some embodiments, the initial sealing material 52 can be omitted, such that the sealing material 56 contacts all sidewalls of the memory cell 30, as illustrated in FIG. 2E. After forming the sealing material 56, the method of forming the memory array further comprises forming an isolation material 54 continuously surrounding the sealing material 56, wherein the isolation material 54 can be formed of a material similar to the isolation regions 48b of FIG. 4F. In some embodiments, the isolation material 54 comprises a dielectric material different than the initial sealing material 52 and/or the continuous sealing material 56. In subsequent processes, the intermediate array structure 100 may be chemical-mechanically polished to remove the isolation material 54 above the top surfaces of the upper conductive lines 20 (not shown).

Thus, intermediate array structure 100, similar to the memory array 100 of FIGS. 2A-2D, includes a continuous sealing material 56 laterally surrounding each of the memory cell pillars of the memory cell array. The memory cell pillar includes the first and second active elements 38 and 34 in the illustrated embodiment, and further includes initial sealing materials 52 formed on sidewalls of each of the memory cell pillars that are opposing each other in the y-direction. The continuous sealing material 56 has no interfaces through which heat within the cell 30 can transfer relatively fast to and from adjacent cells.

Figure 5B:
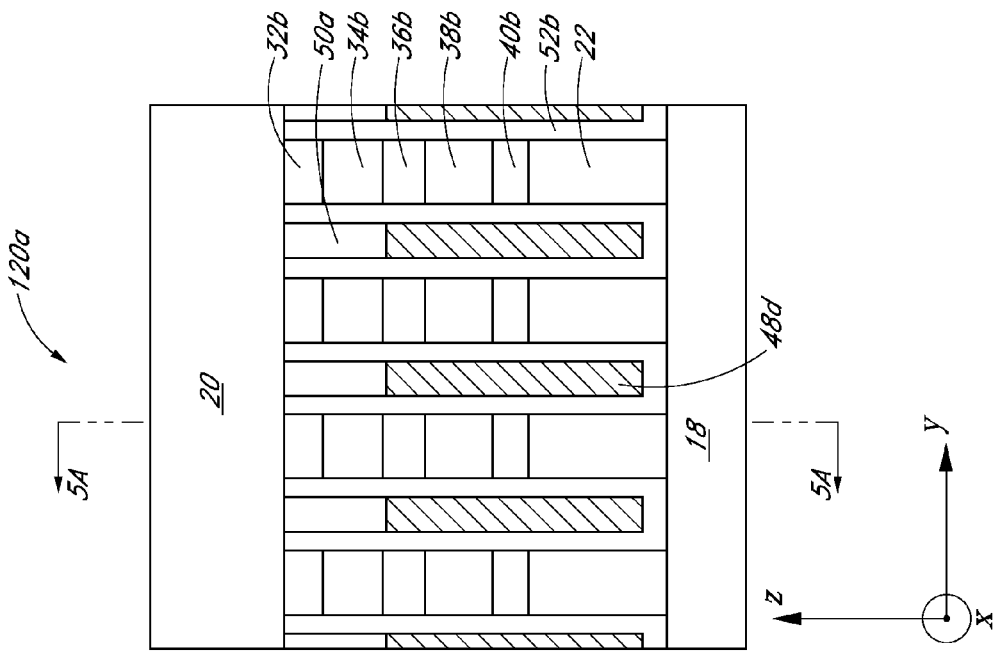
Figure 5A:
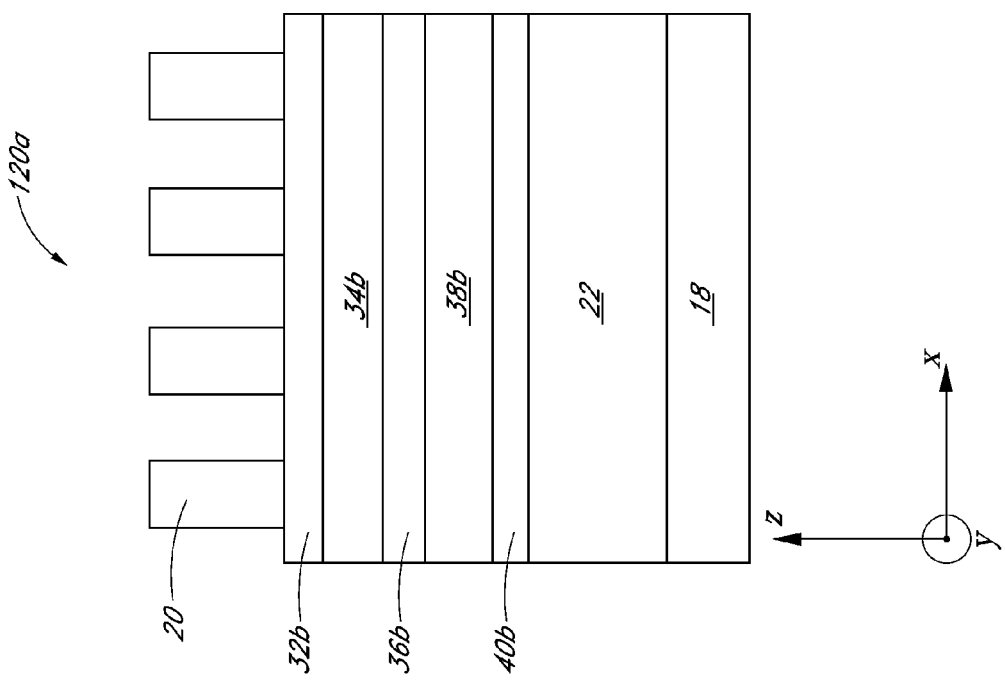
Figure 5F:
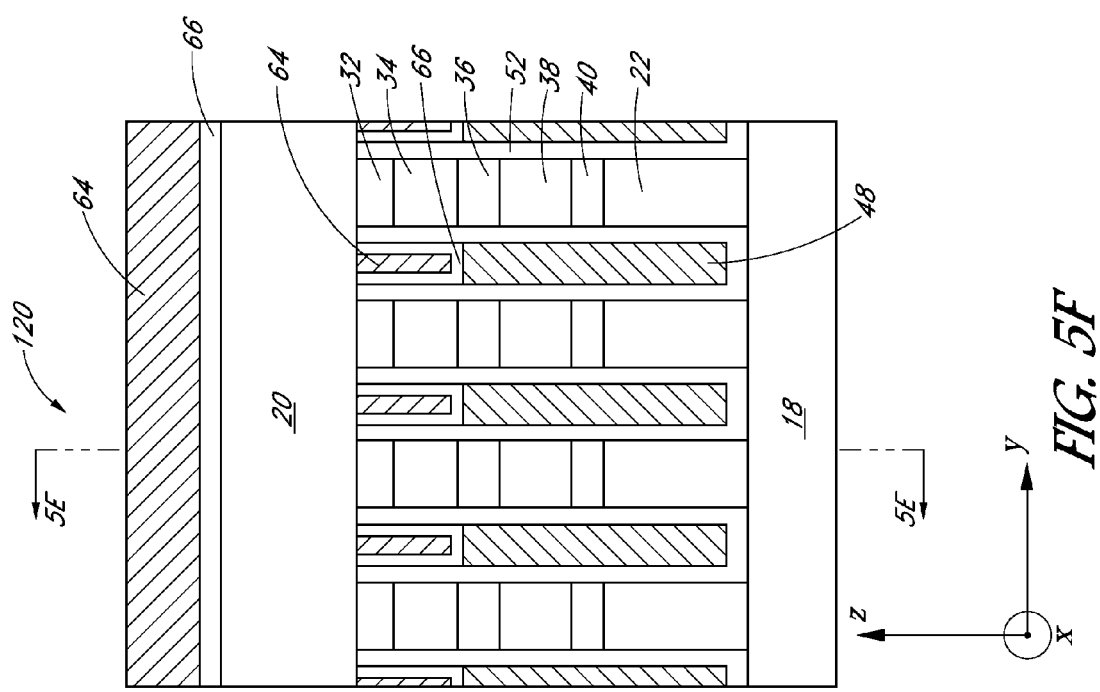
Figure 5E:
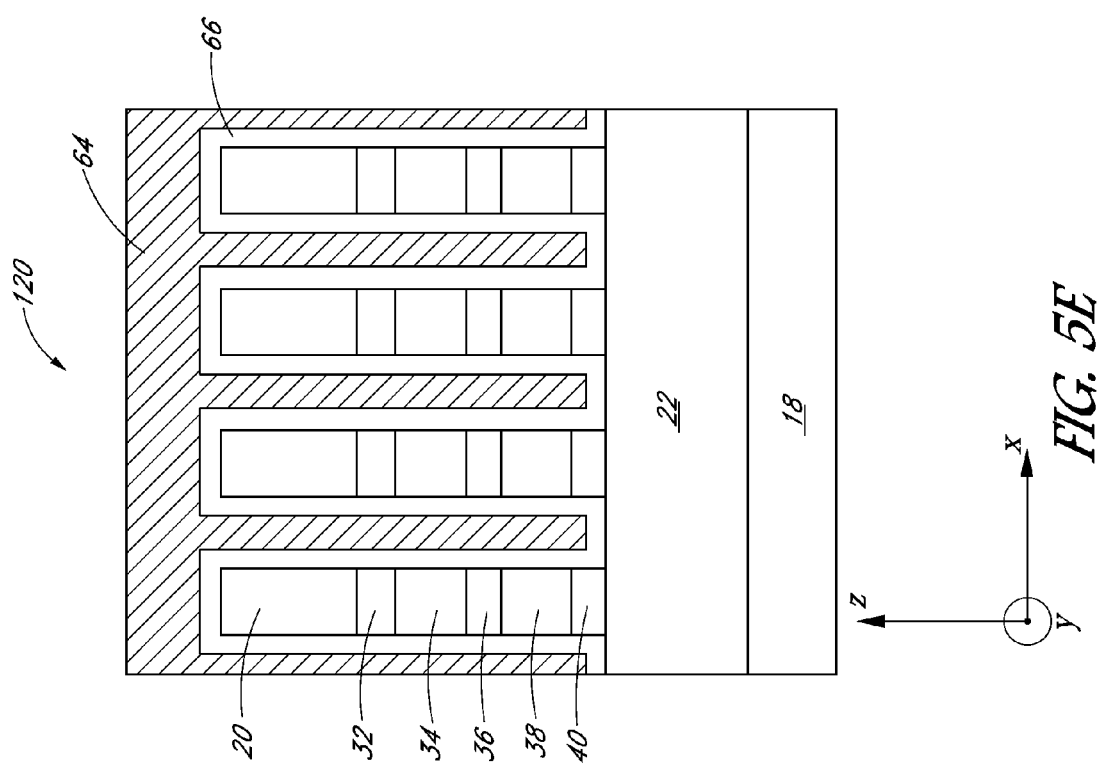

FIGS. 5A-5F illustrate cross-sectional views of a memory array at various stages of fabrication according to alternative embodiments. In the following, FIGS. 5A, 5C and 5E represent cross-sectional views of intermediate array structures of a cross-point memory array at various stages of fabrication, viewed in a y-direction (e.g., a digit line direction), and FIGS. 5B, 5D and 5F represent cross-sectional views of the intermediate array structures corresponding to the intermediate structures of FIGS. 5A, 5C and 5E, respectively, viewed in an x-direction (e.g., a word line direction). Processes leading up to the intermediate structures of FIGS. 5A and 5B are similar to processes leading up to the intermediate structures of FIGS. 4E and 4F. Thus, prior to forming an intermediate array structure 120a of FIGS. 5A and 5B, forming the upper conductive lines 20 exposes portions of the upper electrode lines 32b of the alternating line stacks, as seen in FIG. 5A, and portions of the initial isolation dielectric regions between adjacent upper conductive lines 20, similar to the initial isolation dielectric regions 48b described above with respect to FIGS. 4E and 4F.

Referring to FIGS. 5A and 5B, the intermediate array structure 120a is similar to the intermediate array structure 100d of FIGS. 4G and 4H, except that removing at least upper portions of the initial isolation dielectric materials is a partial recess process that at least exposes sidewalls of the storage element of upper portions the memory cell line stacks. In the illustrated embodiment, the exposed sidewalls are covered with the initial sealing material 52b. In some other embodiments, however, the initial sealing material 52b may be omitted. In the illustrated embodiment, lower portions of the initial isolation dielectric regions 48d are left in place such that the upper portions of the spaces 50a extend to partially expose upper sidewalls of the memory cell line stacks while the sidewalls of lower portions of the memory cell line stacks remain covered by remaining isolation dielectric regions 48d. In the illustrated embodiment, exposed upper portions of memory cell line stacks include the upper electrode line 32b and the second active element 34b (e.g., storage element). It will be appreciated, however, that in other embodiments, the exposed memory cell line stacks can further include features below the second active element 34b.

Referring to FIGS. 5C and 5D, intermediate array structure 120b is formed by etching the memory cell line stacks using the upper conductive lines 20 (and any hard mask materials thereover) as a mask to form spaces 50a around memory cell pillars. Intermediate array structure 120b is similar to the intermediate array structure 100e of FIGS. 4I and 4J, except that the remaining isolation dielectric regions 48 are left between memory cell pillars underneath the upper conductive lines 20. Thus side walls of the memory cell pillars that are opposing each other in the x-direction are exposed by the spaces 50a (see FIG. 5C), while side walls of the memory cell pillars that are opposing each other in the y-direction are only partially exposed by the spaces 50a (see FIG. 5D). In some embodiments, at least the storage elements 34 of upper portions of the memory cell pillars have all of their sidewalls exposed and surrounded by the spaces 50a. In the illustrated embodiment, the storage element is represented by the second active element 34. In other embodiments, where the storage element could be the first active element 38, the recess in initial isolation material 48 can be deeper to expose at least the storage element sidewalls. Lower portions of the pillars remain covered by the remaining isolation dielectric regions 48.

Referring to FIGS. 5E and 5F, intermediate array structure 120 is formed by forming a continuous sealing material 66 around the exposed portions of the memory cell pillars, followed by deposition of a filler material in the form of an isolation material 64. The intermediate array structure 120 is similar to the intermediate array structure 100 of FIGS. 4K and 4L, except that the continuous sealing material 66 laterally surrounds only upper portions of the free-standing pillars of FIGS. 5C and 5D, while not surrounding lower portions below the upper surface of the remaining isolation dielectric regions 48. In the illustrated embodiment, the sealing material 66 laterally surrounds the upper portions of the memory cell pillars of the intermediate array structure 120b of FIGS. 5C and 5D, which includes the upper electrode 32 and the second active element 34 (e.g., a storage element). The middle electrode 36, the first active element 38 (e.g., a selector element), and the lower electrode element 40 are not surrounded by the sealing material 66 and are rather only lined on two opposing walls, as shown in FIG. 5E. After forming the sealing material 66, the method of forming the memory array further comprises forming an isolation material 64 which fills the gaps among the memory cell pillars and the remaining isolation regions 48, including surrounding the continuous sealing material 66 at upper portions of the pillars. The isolation material 64 can be formed of a material similar to the isolation regions 48. In subsequent processes (not shown), the intermediate array structure 120 may be chemical-mechanically polished to remove the isolation material 64 above the top surfaces of the upper conductive lines 20.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A memory device, comprising:
    a plurality of lower conductive lines extending in a first direction;
    a plurality of upper conductive lines extending in a second direction crossing the first direction;
    a plurality of memory cell pillars formed at intersections between the lower conductive lines and the upper conductive lines, wherein each of the memory cell pillars comprises a storage material element, wherein at least three sides of the storage material element are surrounded by a continuous sealing material, wherein the continuous sealing material extends to line opposing sidewalls of an upper conductive line of the plurality of upper conductive lines that is connected to the each of the memory cell pillars; and
    an isolation material, wherein the isolation material surrounds the continuous sealing material.

2. The memory device of claim 1, wherein the storage material element of the each of the memory cell pillars comprises a chalcogenide material configured to switch between crystalline and amorphous phases during an access operation via an electrical pulse applied between one of the lower conductive lines and one of the upper conductive lines.

3. The memory device of claim 2, wherein the continuous sealing material encloses the storage material element such that during an access operation to access a target storage material element, the temperature of an adjacent neighboring storage material element in the first direction is substantially the same as the temperature of an adjacent neighboring storage material element in the second direction.

4. The memory device of claim 3, wherein the sealing material further encloses an initial sealing material formed on opposing first sidewalls of each of the storage material elements, the first sidewalls extending in the first direction.

5. The memory device of claim 3, wherein the continuous sealing material contacts opposing second sidewalls of each of the storage material elements, the second sidewalls extending in the second direction.

6. A memory device, comprising:
    a lower conductive line extending in a first lateral direction;
    an upper conductive line extending in a second lateral direction crossing the first lateral direction;
    a memory cell stack formed at an intersection between the lower and upper conductive lines, the memory cell stack comprising:
        a first active element disposed over the lower conductive line,
        a second active element disposed over the first active element,
        wherein one of the first and second active elements comprises a storage material and the other of the first and second active elements comprises a selector material;
    a continuous sealing material surrounding at least three sidewalls of the second active element and extending to cover sidewalls of the upper conductive line; and
    an isolation material surrounding the continuous sealing material.

7. The memory device of claim 6, wherein the isolation material comprises a dielectric material different from the continuous sealing material.

8. The memory device of claim 6, wherein the continuous sealing material comprises silicon nitride.

9. The memory device of claim 6, wherein the continuous sealing material further surrounds at least three sidewalls of the first active element.

10. The memory device of claim 6, wherein the second active element comprises the storage material and the first active element comprises the selector material, wherein the storage material comprises a first chalcogenide material.

11. The memory device of claim 10, wherein the selector material comprises a second chalcogenide material different from the first chalcogenide material.

12. The memory device of claim 6, wherein the continuous sealing material contacts opposing sidewalls of second active element extending in the second direction.

* * * * *